United States Patent
Okumura

(10) Patent No.: US 12,216,271 B2
(45) Date of Patent: Feb. 4, 2025

(54) OPTICAL DEVICE, DISTANCE MEASUREMENT APPARATUS, AND MOBILE OBJECT

(71) Applicant: Soh Okumura, Kanagawa (JP)

(72) Inventor: Soh Okumura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 718 days.

(21) Appl. No.: 17/456,427

(22) Filed: Nov. 24, 2021

(65) Prior Publication Data

US 2022/0171158 A1    Jun. 2, 2022

(30) Foreign Application Priority Data

Nov. 27, 2020   (JP) .................. 2020-197599
Oct. 7, 2021    (JP) .................. 2021-165415
Nov. 15, 2021   (JP) .................. 2021-185455

(51) Int. Cl.
  *G02B 26/08*  (2006.01)
  *G01S 17/34*  (2020.01)
  *H01S 5/02315*  (2021.01)
  *H01S 5/183*  (2006.01)

(52) U.S. Cl.
  CPC .......... *G02B 26/0858* (2013.01); *G01S 17/34* (2020.01); *H01S 5/18366* (2013.01); *H01S 5/02315* (2021.01); *H01S 5/18305* (2013.01)

(58) Field of Classification Search
  CPC ................. G02B 26/0858; H01S 5/18366
  USPC ............................................. 372/20
  See application file for complete search history.

(56) References Cited

U.S. PATENT DOCUMENTS

| | | | |
|---|---|---|---|
| 2005/0063038 A1* | 3/2005 | Filhol | G02B 26/0858 |
| | | | 359/224.1 |
| 2018/0267293 A1 | 9/2018 | Fujishima et al. | |
| 2020/0144793 A1* | 5/2020 | Getz | H01S 5/18366 |

FOREIGN PATENT DOCUMENTS

| | | |
|---|---|---|
| JP | 2018-155816 | 10/2018 |
| WO | WO2014/018943 A1 | 1/2014 |

* cited by examiner

*Primary Examiner* — Tuan N Nguyen
(74) *Attorney, Agent, or Firm* — IPUSA, PLLC

(57) ABSTRACT

An optical device includes: a first reflector; a second reflector facing the reflector; a light emitter between the first reflector and the second reflector; a base supporting the second reflector with space between the light emitter and the second reflector; a piezoelectric body configured to, in response to application of drive voltage, deform to cause the second region to deform to drive the second reflector so as to change a distance between the first reflector and the second reflector. The base has a first region and a second region having a lower stiffness than the first region. The second region has the second reflector and the piezoelectric body thereon. The optical device is configured to emit a laser beam whose wavelength is changeable with the distance between the first reflector and the second reflector.

17 Claims, 17 Drawing Sheets

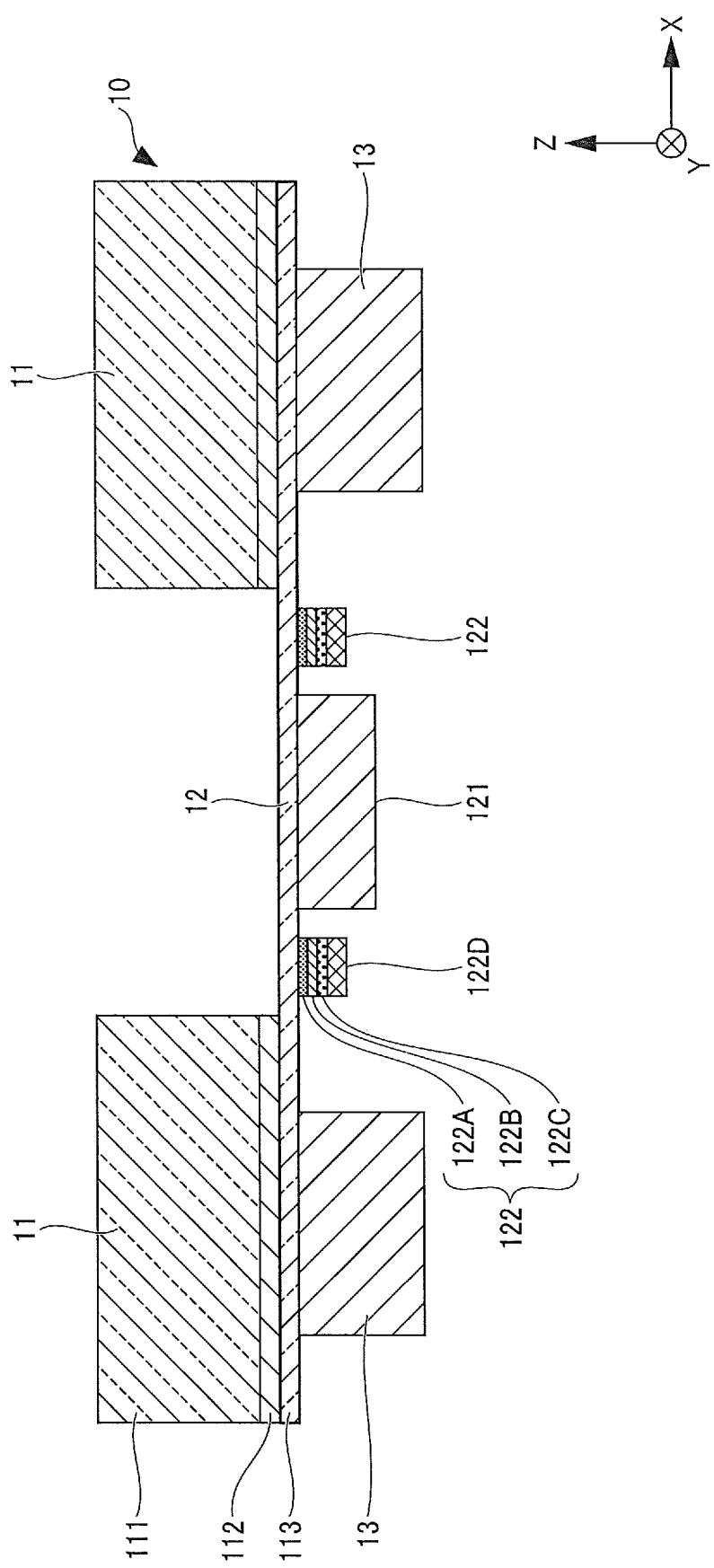

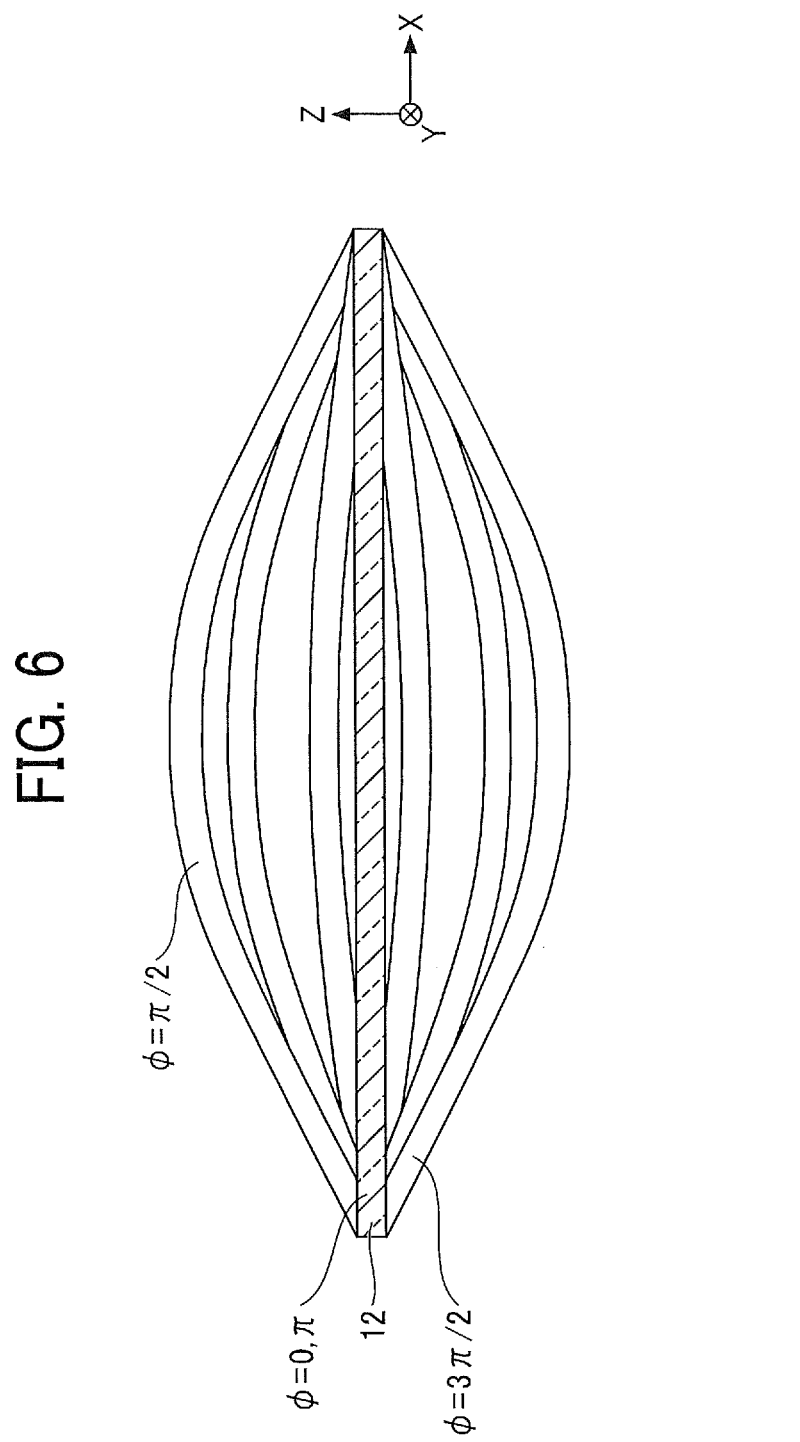

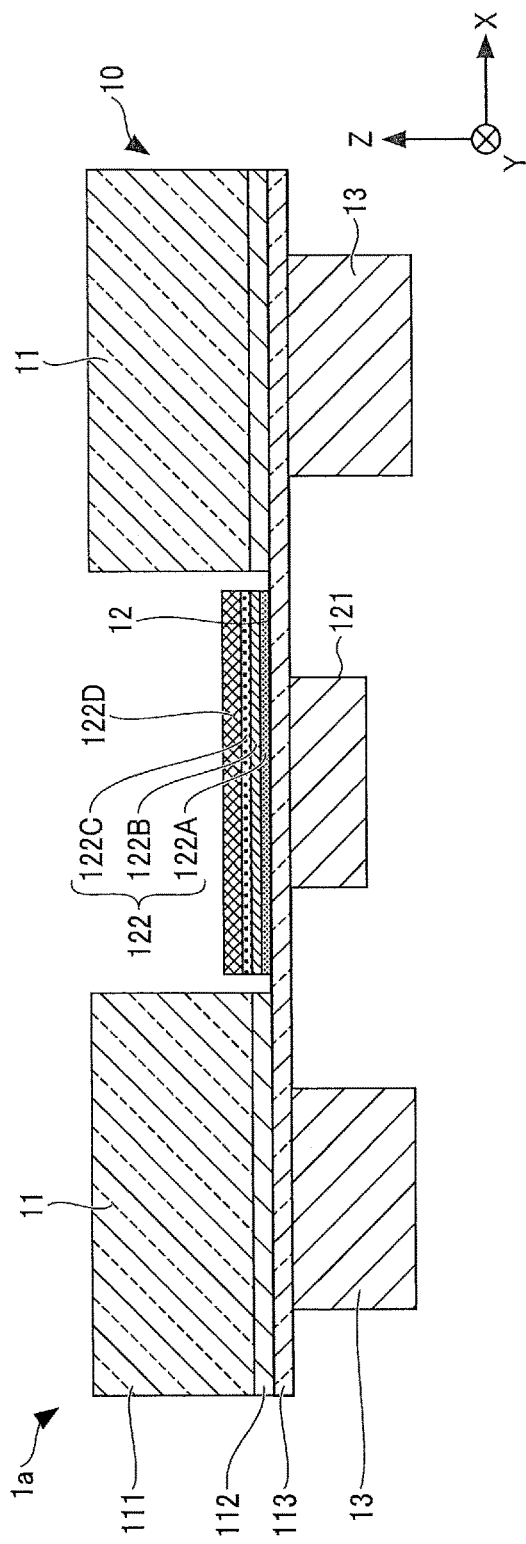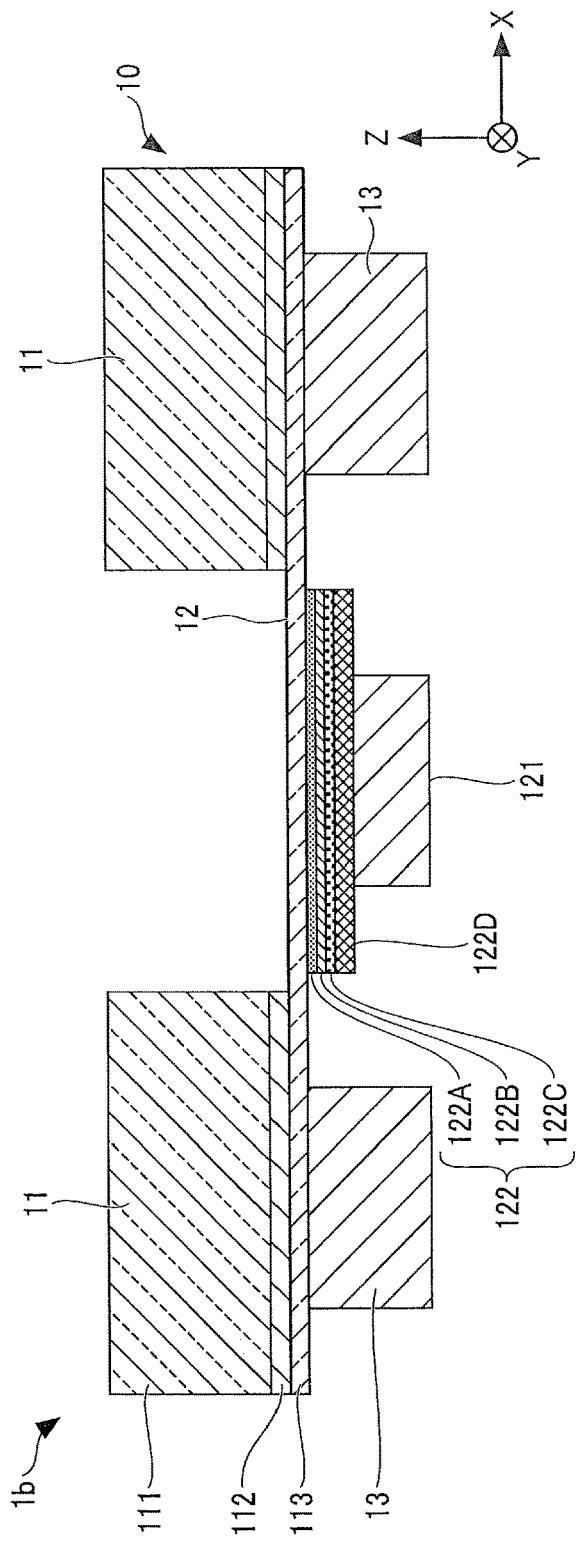

COMPARATIVE EXAMPLE

OPTICAL DEVICE, DISTANCE MEASUREMENT APPARATUS, AND MOBILE OBJECT

CROSS-REFERENCE TO RELATED APPLICATIONS

This patent application is based on and claims priority pursuant to 35 U.S.C. § 119(a) to Japanese Patent Application No. 2020-197599, filed on Nov. 27, 2020, Japanese Patent Application No. 2021-165415, filed on Oct. 7, 2021, and Japanese Patent Application No. 2021-185455, filed on Nov. 15, 2021 in the Japan Patent Office, the entire disclosure of which is hereby incorporated by reference herein.

BACKGROUND

Technical Field

The present disclosure relates to an optical device, a distance measurement apparatus, and a mobile object.

Related Art

Conventionally, a wavelength variable laser used as a light source of a frequency modulated continuous wave light detection and ranging (FMCW LiDAR) device is known.

Such a wavelength variable laser includes: an optical resonator including a first mirror and a second mirror; a gain region between the first mirror and the second mirror; and an electrostatically-actuated micro-electromechanical systems (MEMS) actuator. The MEMS actuator regulates air gap between the first mirror and the second mirror.

SUMMARY

An optical device includes: a first reflector; a second reflector facing the reflector; a light emitter between the first reflector and the second reflector; a base supporting the second reflector with space between the light emitter and the second reflector; a piezoelectric body configured to, in response to application of drive voltage, deform to cause the second region to deform to drive the second reflector so as to change a distance between the first reflector and the second reflector. The base has a first region and a second region having a lower stiffness than the first region. The second region has the second reflector and the piezoelectric body thereon. The optical device is configured to emit a laser beam whose wavelength is changeable with the distance between the first reflector and the second reflector.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 2 is an enlarged cross-sectional view of a configuration of a base and its surroundings according to an embodiment;

FIG. 6 is an illustration of an exemplary oscillation of the second region;

FIGS. 10A and 10B are enlarged cross-sectional views of configurations of a second region 12 and its surroundings according to variations of an embodiment, FIG. 10A illustrating a configuration of a second region and its surroundings according to a first variation of an embodiment, and FIG. 10B illustrating a configuration of a second region and its surroundings according to a second variation of an embodiment;

Figure 1A:
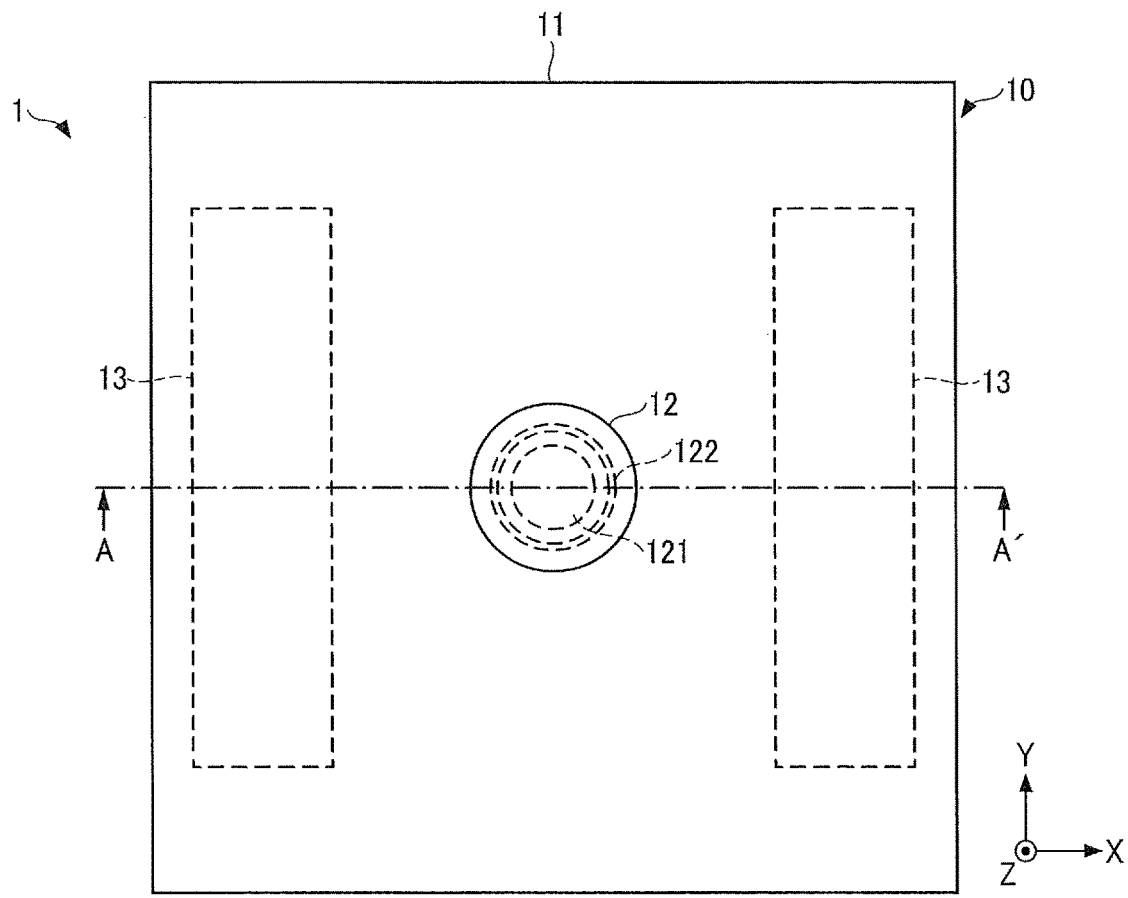
FIGS. 1A and 1B are illustrations of a configuration of a light source device according to a first embodiment, FIG. 1A being a plane view of the light source device according to the first embodiment, and FIG. 1B being a cross-sectional view taken along line A-A' in FIG. 1A.

The accompanying drawings are intended to depict embodiments of the present invention and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

As used herein, the term "connected/coupled" includes both direct connections and connections in which there are one or more intermediate connecting elements.

Embodiments of the present disclosure enables changes in a wavelength of a laser beam over a wide wavelength range and at a high speed.

Embodiments of the present disclosure are described referring to the drawings. Like reference signs are applied to identical or corresponding components throughout the drawings and redundant description thereof may be omitted.

The embodiments to be described below exemplify an optical device, which implements the technical concepts of the present disclosure. However, no limitation is intended therein. Unless otherwise specified, shapes of components, relative arrangements thereof, and values of parameters described below are not intended to limit the scope of the present invention but are intended to exemplify the scope of the present invention. The relative positions of the elements illustrated in the drawings are exaggerated for purpose of clear illustration.

An optical device according to an embodiment includes a light emitter, a first reflector, a second reflector, a base, and a piezoelectric member as a piezoelectric body. The second reflector faces the first reflector with the light emitter between the first reflector and the second reflector. With a space between the light emitter and the second reflector, the base supports the second reflector. The piezoelectric body deforms in response to application of drive voltage. The base includes a first region and a second region having a lower stiffness than the first region. The second reflector and the piezoelectric body are in the second region.

The distance between the first reflector and the second reflectors, or the inter-reflector distance refers to a resonator length. In the optical device, the piezoelectric body deforms the second region to drive the second reflector, in response to application of drive voltage. Further, the optical device emits a laser beam whose wavelength changes with the distance between the first reflector and the second reflector.

In the electrostatic actuation method that electrostatically actuates a movable portion to change the resonator length, for example, the actuation of the movable portion at a high speed and with a larger amount of displacement is restricted due to limitations of a resonance frequency or a spring constant of the movable portion. There is room for improvement in changing the wavelength of a laser beam at a high speed and in a wide wavelength range.

In at least one embodiment, the resonator length is changed by deforming a thin second region using the piezoelectric body and driving the second reflector at a high speed and with a large amount of displacement. This enables the wavelength of a laser beam to change over a wide range at a high speed.

The following describes a light source device that emits multiple laser beams in parallel, according to an embodiment. In the drawings to be described below, an X-direction, or the X-axis is a given direction within a plane parallel to a reflecting surface of the first reflector, and a Y-direction, or the Y-axis is a direction orthogonal to the X-axis within the plane parallel to the reflecting surface of the first reflector. Further, a Z-direction, or the Z-axis is a direction orthogonal to each of the X-axis and the Y-axis. The light source device emits a laser beam along the Z-axis.

However, these axes are used for convenience of description, and no particular limitation is imposed on the orientation of the optical device. The optical device is used in any orientation.

First Embodiment

A light source device according to a first embodiment will be described.

The overall configuration of a light source device 1 is described with reference to FIGS. 1A and 1B.

Figure 1B:
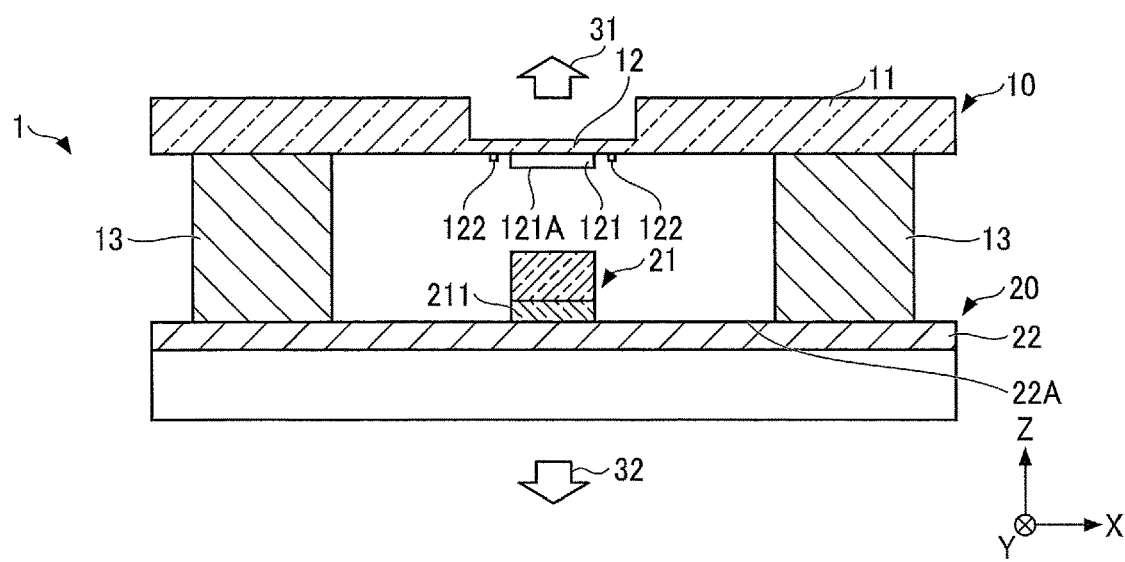

FIGS. 1A and 1B are illustrations of an exemplary configuration of the light source device 1. FIG. 1A is a plan view of the light source device 1. FIG. 1B is a cross-sectional view taken along line A-A' in FIG. 1A. In FIGS. 1A and 1B, the light source device 1 includes a base 10, a joint 13, and a vertical-cavity surface-emitting lasers (VCSEL) device 20.

The base 10 is a plate having a rectangular shape in plane view and includes a first region 11 and a second region 12. The second region 12 is substantially circular in plan view at substantially the center of the base 10, and serves as a movable portion. The second region 12 is formed to have a thickness (i.e., the length along the Z-axis) smaller than the thickness of the first region 11 (i.e., the second region 12 is thinner than the first region 11). The first region 11 is another region other than the second region in the base 10, and serves as a support.

The second region 12 includes a second reflector 121 and a piezoelectric element 122 on the −Z-surface of the second region 12. The −Z-surface of the second region 12 faces a light emitter 211 to be described below, meaning that the −Z-surface of the second region 12 refers to a surface of the second region 12, which faces the light emitter 211.

The second reflector 121 is formed at substantially the center of the second region 12 and is substantially rectangular in planar view. The piezoelectric element 122 is an example of a piezoelectric body surrounding the second reflector 121. The piezoelectric element 122 is in a ring shape surrounding the second reflector 121. The piezoelectric element 122 may be in another shape other than a ring shape as long as the second reflector 121 is surrounded by the piezoelectric element 122.

The piezoelectric element 122 deforms (for example, expands and contracts) in accordance with a drive voltage applied through an electrode. The deformation of the piezoelectric element 122 causes the second region 12 to elastically deform, thus allowing the second reflector 121 to displace in the Z-direction.

In the light source device 1, the VCSEL device 20 is disposed upstream from the base 10 in the Z-direction (i.e., downstream from the base 10 in the −Z-direction), with the joint 13 between the base 10 and the VCSEL device 20. The base 10 and the VCSEL device 20 are joined together to be attached firmly to each other by the joint 13 using, for example, an atomic diffusion bonding method.

The VCSEL device 20 includes a mesa 21 and a first reflector 22. The mesa 21 is an island-shaped structure including a light emitter 211. The VCSEL device 20 includes the first reflector 22 downstream from second reflector 121 in the −Z-direction with the light emitter 211 between the first reflector 22 and the second reflector 121. In other words, the first reflector 22 faces the second reflector 121 with the light emitter 211 therebetween.

The light emitter 211 emits light in accordance with electric current injected through the electrode. The first reflector 22, the second reflector 121, and the light emitter 211 between the first reflector 22 and the second reflector 121 constitute a resonator. In the resonator, light emitted by each light emitter 211 is reflected alternately by the first reflector 22 and the second reflector 121, and travels back and forth between the first reflector 22 and the second reflector 121 so as to be amplified.

More specifically, light emitted by the light emitter 211 is reflected alternately by a reflecting surface 22A of the first reflector 22 and a reflecting surface 121A of the second reflector 121, meaning that light emitted by the light emitter 211 travels back and forth between the reflecting surface 22A and the reflecting surface 121A, thus to be amplified.

The amplification of light causes the occurrence of lasing when gain and loss are balanced. Thus, the light emitter 211 emits a laser beam. The light source device 1 emits a laser beam through the lower-reflectivity surface between the second reflector 121 and the first reflector 22. When the reflectivity is lower for the second reflector 121 than the first reflector 22, the light source device 1 emits a laser beam through the second reflector 121 in an emission direction 31, or a first direction as illustrated in FIG. 1B. When the reflectivity is lower for the first reflector 22 than the second reflector 121, the light source device 1 emits a laser beam through the first reflector 22 in an emission direction 32, or a second direction as illustrated in FIG. 1B.

In response to drive voltage applied to the piezoelectric element 122, the second region 12 elastically deforms and causes the second reflector 121 to displace along the Z-axis. The displacement of the second reflector 121 changes the distance between the first reflector 22 and the second reflector 121, thus causing the resonator length to vary. The variation in resonator length enables the light emitter 211 to emit a laser beam having a wavelength changeable with the resonator length.

Next, a configuration of the base 10 and its surroundings will be described with reference to FIG. 2. FIG. 2 is an enlarged cross-sectional view of the configuration of the base 10 and its surroundings according to an embodiment.

The base 10 includes the second reflector 121 and the piezoelectric element 122 on one silicon on insulator (SOI) substrate that has undergone, for example, an etching process.

In FIG. 2, the first region 11 includes a support layer 111, an oxide insulating layer 112, and a silicon active layer 113. In contrast, a component constituting the second region 12 may be formed by removing the support layer 111 and the oxide insulating layer 112 from the SOI substrate through etching, and is thus composed of the silicon active layer 113 alone. In some embodiments, a component constituting the second region 12 may include a supporting layer and a supporting layer, in addition to the silicon active layer 113.

The second region 12 has a thickness in the Z-direction smaller than the length in the X-direction or the Y-direction, to have an elasticity and a low stiffness in the Z-direction. The second region 12 is movable by deformation of the piezoelectric element 122. The first region 11, which has a higher stiffness than the second region 12 does, deforms by a small amount due to deformation of the piezoelectric element 122. Such a first region 11 supports the second region 12.

The second reflector 121 is on the −Z-surface of the second region 12, or on the −Z-surface of the first region 11. The second reflector 121 has a structure having a reflectivity sufficient to enable the occurrence of lasing, including: a multilayer-film mirror or a metal thin film in which two or more thin films having different refractive indexes are alternately laminated on the component constituting the second region 12; and a high contrast grating (HCG) having a periodic structure in which a material with a thickness equivalent to a wavelength is periodically arranged on the component constituting the second region 12.

The piezoelectric element 122 includes a lower electrode 122A, a piezoelectric portion 122B, and an upper electrode 122C, which are stacked on the second region 12. On the upper electrode 122C, an overcoat 122D is provided to protect the piezoelectric element 122.

The upper electrode 122C and the lower electrode 122A contain gold (Au) or platinum (Pt). The piezoelectric portion 122B contains a piezoelectric material such as lead zirconate titanate (PZT) or aluminum nitride (AlN). In some embodiments, an insulating layer is between the piezoelectric elements 122 to prevent shorting between the piezoelectric elements 122. The piezoelectric portion 122B, when a positive or negative voltage in the polarization direction is applied thereto, is deformed (for example, expanded or contracted) in proportion to the potential of the applied voltage and exhibits inverse piezoelectric effect.

The joint 13 include an adhesive layer, a diffusion preventing layer, and a joining layer, which are sequentially stacked in the −Z-direction. The joining layer uses Titanium (Ti), the diffusion preventing layer uses platinum (Pt), and the adhesive layer uses gold (Au) or aluminum oxide ($Al_2O$).

The shape of the second region 12 in plan view is not limited to a circular shape, and the second region 12 may have a quadrangular shape, a triangular shape, an elliptical shape, or an asymmetric shape. A part of the second reflector 121 and the piezoelectric element 122 may be included in the first region 11, instead of being entirely including in the second region 12.

In the present embodiment, the piezoelectric element 122 is between two joints 13. In some embodiments, one or more joints 13 are provided in the light source device 1. For example, one joint 13, which is arranged to surround the piezoelectric element 122, increases the symmetry of the geometry of the surface to be joined with the VCSEL device 20 and prevents tilting of the base 10 joined with the VCSEL device 20. In this arrangement, a part of the joint 13 is open to lead out the wiring for driving the piezoelectric element 122, to the outside of the joint 13.

For another example, two or more joints 13, which are arranged symmetrically about the center of the second reflector 121 in the plane of the second reflector 121, prevents tilting of the base 10 jointed together with the VCSEL device 20. For still another example, three joints 13 are arranged at an interval of 120° with respect to the center of the second reflector 121. Further, four joints 13 are arranged at the four sides of the second reflector 121.

In some embodiments, the joint 13 serves as an electrode by electrically connecting the piezoelectric element 122 to the joint 13.

Further, the second reflector 121 is arranged at substantially the center of the ring-shaped piezoelectric element 122 to prevent overlapping of the piezoelectric element 122 with the second reflector 121 along the Z-axis.

Figure 3:
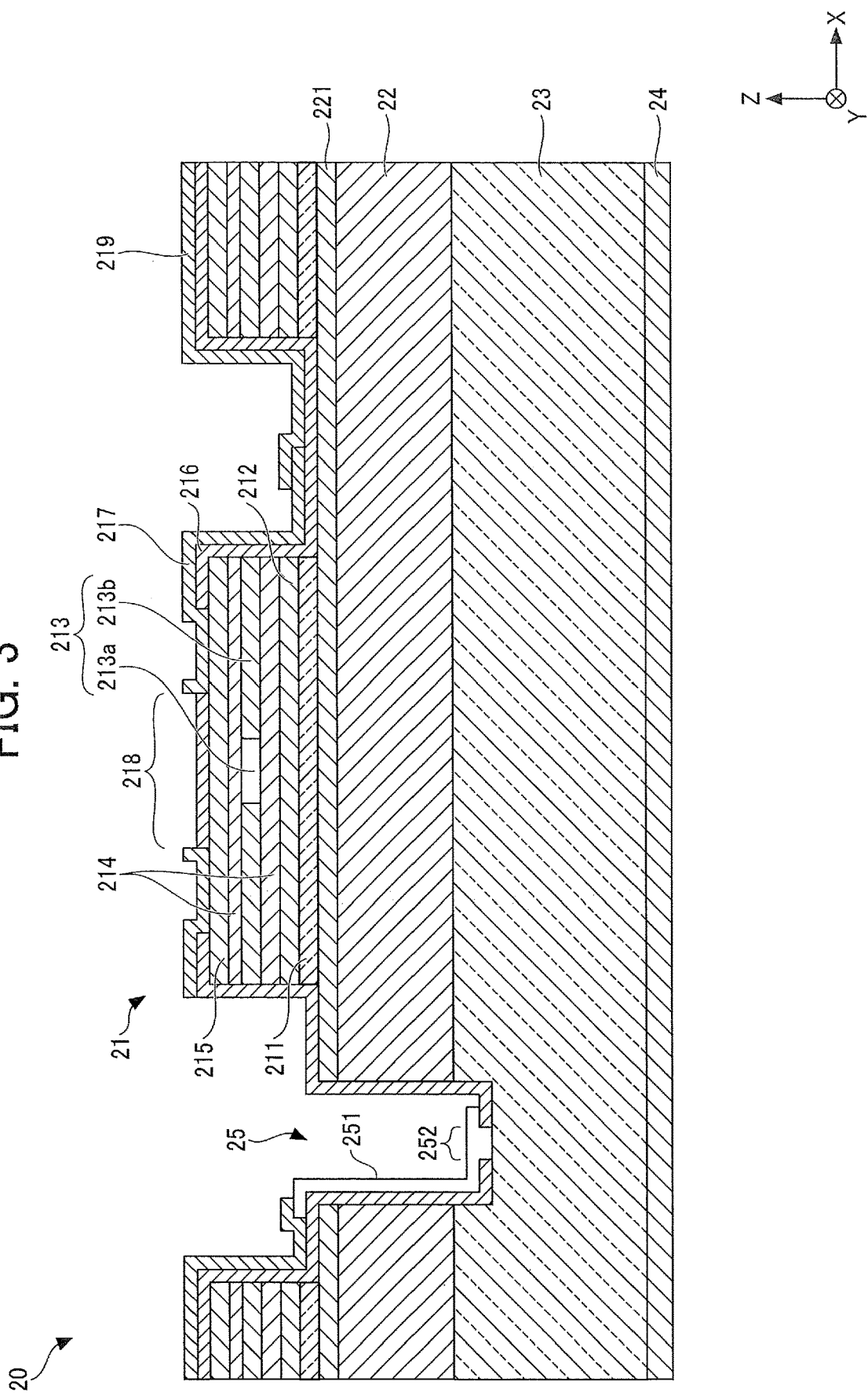
FIG. 3 is a cross-sectional view of an exemplary configuration of a VCSEL device.

Next, a configuration of the VCSEL device 20 will be described with reference to FIG. 3. FIG. 3 is a cross-sectional view of an exemplary configuration of the VCSEL device 20.

In the light source device 1, the first reflector 22 included in the VCSEL device 20 and the second reflector 121 separate from the VCSEL device 20 constitute a resonator. In this configuration, the VCSEL device 20, which is a surface-emitting semiconductor laser including one reflector constituting the resonator, is referred to as a half-VCSEL.

In FIG. 3, the VCSEL device 20 includes a mesa 21, a first reflector 22, a semiconductor substrate 23, an antireflection film 24, and a groove 25. On the +Z-surface of the semiconductor substrate 23, the first reflector 22, a spacer layer 221, and the mesa 21 are stacked. On the −Z-surface of the semiconductor substrate 23, the antireflection film 24 is formed. The groove 25 is formed by removing the spacer layer 221 and the first reflector 22 around the mesa 21 by etching.

The first reflector 22 is a semiconducting multilayer reflector formed on the semiconductor substrate 23 such as an n-GaAs substrate. The first reflector 22 includes, for example, a low-refractive-index layer made of n-$Al_{0.9}Ga_{0.1}As$ and a high-refractive-index layer made of n-$Al_{0.2}Ga_{0.8}As$.

Between the refractive-index layers of the first reflector 22, a composition-graded layer having a thickness of 20 nm in which the composition gradually changes from one composition to the other composition is provided to reduce the electrical resistance. Each of the refractive-index layers includes ½ of the adjacent composition-graded layer, and has an optical thickness of $\lambda/4$ where $\lambda$ denotes the oscillation wavelength. Note that when the optical thickness is $\lambda/4$, the actual thickness D of the layer is $D=\lambda/4\,n$ (where n denotes a refractive index of a medium of that layer).

The spacer layer 221 on the first reflector 22 is, for example, a non-doped AlGaInP layer.

The mesa 21 includes the light emitter 211, the spacer layer 212, a selective oxide layer 213, a pair of semiconducting multilayer reflectors 214, a contact layer 215, an insulating layer 216, and an electrode 217.

The spacer layer 212 is formed on the light emitter 211. The spacer layer 212 is, for example, a non-doped AlGaInP layer.

A region including the spacer layer 212 and the light emitter 211 is also referred to as a resonator structure or a resonator region, includes ½ of the adjacent composition-graded layer, and has an optical thickness of one wavelength ($\lambda$).

In the mesa 21, the light emitter 211 is provided between the spacer layer 221 and the spacer layer 212. The light emitter 211 emits light in response to injection of electric current, and amplifies light traveling back and forth between the first reflector 22 and the second reflector 121, which constitute the resonator. The light emitter 211 may be referred to as an active layer. The light emitter 211 is an active layer having a three quantum well structure including three quantum well layers and four barrier layers. Each quantum well layer is, for example, an InGaAs layer, and each barrier layer is, for example, an AlGaAs layer. The light emitter 211 is disposed in the center of the resonator structure, which is a position corresponding to the antinode in the standing wave distribution of the electric field, so as to achieve a high stimulated-emission rate.

The selective oxide layer 213 includes an oxidized region 213a and a non-oxidized region 213b. The selective oxide layer 213 contains p-AlAs and has a thickness of 30 nm. The selective oxide layer 213 is between the pair of semiconducting multilayer reflectors 214. For example, the selective oxide layer 213 is within the second pair of a high refractive index layer and a low refractive index layer when counted from the spacer layer 212. The selective oxide layer 213 may include layers such as the composition-graded layer and an intermediate layer. In the present embodiment, the selective oxide layer 213 includes layers actually oxidized.

The contact layer 215 is formed on the semiconducting multilayer reflector 214. The contact layer 215 is, for example, a p-GaAs layer.

The mesa 21 and the groove 25 is formed by removing a part of the lamination of the contact layer 215, the semiconducting multilayer film reflector 214, the spacer layer 212, and the light emitter 211 through etching.

The mesa 21 includes the insulating layer 216 on its surface. Examples of material insulating layer 216 include SiN, SiON, and SiO2. The insulating layer 216 includes an opening 218 that exposes a part of the contact layer 215 of the mesa 21. The insulating layer 216 includes the opening 218 at a position overlapping with the non-oxidized region 213b in plan view.

The electrode 217, which is electrically connected to the contact layer 215 through the opening 218, is formed on the insulating layer 216 of the mesa 21. The electrode 217 is, for example, a lamination in which a layer of Ti, a layer of Pt, and a layer of Au are stacked in this order in the +Z-direction in FIG. 3.

The groove 25 includes the insulating layer 216 on its surface. A part of the insulating layer 216 forms an opening 252 that exposes a part of the semiconductor substrate 23.

The insulating layer 216 on the groove 25 includes an electrode 251 electrically connected to the contact layer 215 through the opening 252. The electrode 251 is, for example, a lamination in which a layer of germanium alloy (AuGe), a layer of nickel (Ni), and a layer of gold (Au) are stacked in this order in the +Z-direction in FIG. 3.

The wiring 219 is electrically connected to each of the electrodes 217 and 251. The wiring 219 is, for example, a lamination in which a of Ti, a layer of Pt, and a layer of Au are stacked in this order in the +Z-direction in FIG. 3.

Figure 4A:
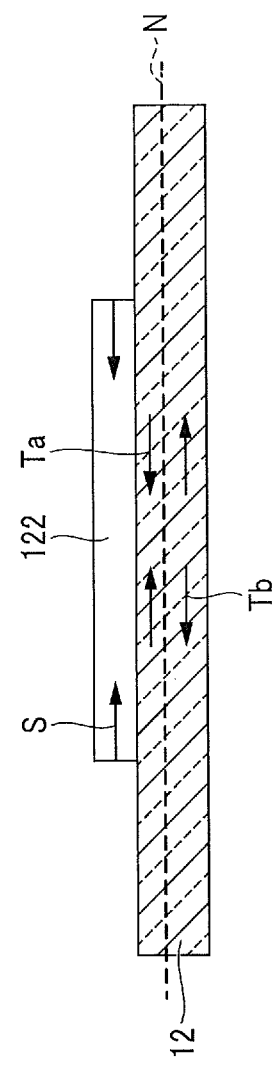
FIGS. 4A and 4B are illustrations of an exemplary operation of a second region, FIG. 4A being an illustration of generation of stress and FIG. 4B being an illustration of deformation of the second region.
Figure 4B:
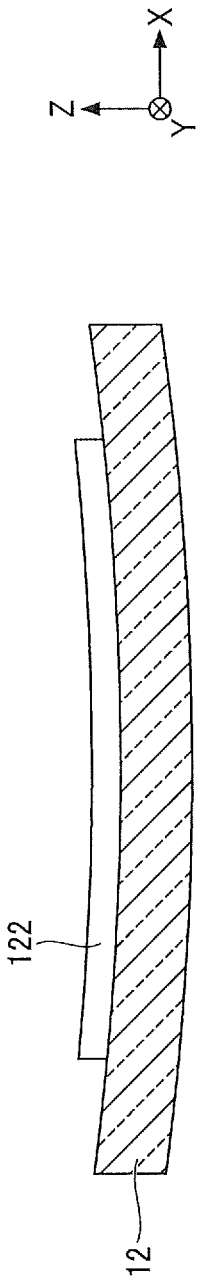

FIGS. 4A and 4B are illustrations of an exemplary operation of the second region 12.

FIG. 4A is an illustration of generation of stress. FIG. 4B is an illustration of deformation of the second region.

In response to a drive voltage applied to the piezoelectric element 122 in the second region 12 to cause contraction of the piezoelectric element 122, the piezoelectric element 122 is contracted. Since the end of the second region 12 is connected to the first region 11, the end of the second region 12 is not displaced in the Z-direction because of the deformation of the piezoelectric element 122.

Since the piezoelectric element 122 is bonded to the second region 12, the contraction stress S of the piezoelectric element 122 is transmitted to the second region 12. A neutral axis N is present at a given position along the Z-axis within the second region 12. A compressive stress Ta is generated in a first area of the second region 12, which is between the neutral axis N and the piezoelectric element 122, and a tensile stress Tb is generated in a second area of the second region 12, which is on the other side of the neutral axis N. The compressive stress Ta and the tensile stress Tb elastically deform and warp the second region 12 and thus displace its surface in the −Z-direction as illustrated in FIG. 4B.

In response to a drive voltage applied to piezoelectric element 122 to cause expansion of the piezoelectric element 122, a tensile stress is generated in the first area of the second region 12, which is between the neutral axis N and the piezoelectric element 122, and a compressive stress is generated in the second area of the second region 12, which is on the other side of the neutral axis N. These stresses elastically deform the second region 12 and thus displace its surface in the +Z-direction.

Figure 5A:
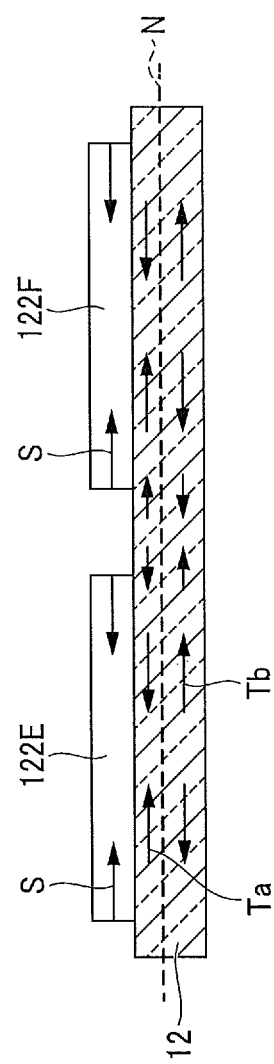
FIGS. 5A and 5B are illustrations of another exemplary operation of a second region, FIG. 5A being an illustration of generation of stress and FIG. 5B being an illustration of deformation of the second region.
Figure 5B:
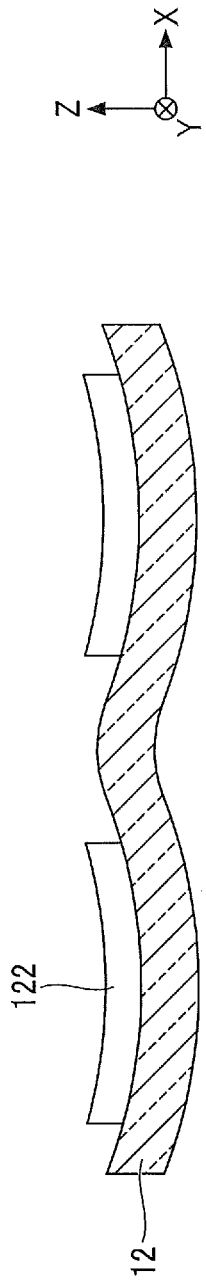

FIGS. 5A and 5B are illustrations of another exemplary operation of the second region 12. FIG. 5A is an illustration of generation of stress. FIG. 5B is an illustration of deformation of the second region 12. In FIGS. 5A and 5B, two piezoelectric elements 122E and 122F are on the +Z-surface of the second region 12.

In response to a drive voltage applied to the piezoelectric elements 122E and 122F to cause contraction of the piezoelectric elements 122E and 122F, the second region 12 deforms in the same manner as in FIG. 4A. In a portion of the second region 12 on which the piezoelectric elements 122E and 122F are not formed, stresses are generated in directions opposite to those of the stresses generated immediately below the piezoelectric elements 122E and 122F. Such stresses cause the portion of the second region 12 to protrude in the +Z-direction. The amount of displacement of that portion varies depending on the dimension in the in-plane direction. In other words, the portion of the second region 12 on which none of the piezoelectric elements 122E and 122F are provided deforms by an amount of deformation that differs with the area of the portion.

FIG. 6 is an illustration of an exemplary oscillation of the second region 12. The second region 12 oscillates while satisfying an equation of motion of the second region 12 when caused to oscillate with a resonance frequency determined by the dimension and geometry of the second region 12, in response to a drive voltage applied to the piezoelectric element 122.

Assuming that the second region 12 is circular having a radius of a and its periphery rendered entirely stationary, an amount of displacement u (r, φ, t) along the Z-axis at a position r relative to the center of the second region 12, an angle φ, and a time t is given by the following Formulae 1 to 3:

$$u_{mn}(r, \phi, t) = \quad \text{Formula 1}$$
$$(A\cos(c\lambda_{mn}t) + B\sin(c\lambda_{mn}t))J_m(\lambda_{mn}r)(C\cos(m\phi) + D\sin(m\phi))$$

$$c = \sqrt{\frac{T}{\rho h}} \quad \text{Formula 2}$$

$$J_x\left(\frac{2.405}{a}r\right) \quad \text{Formula 3}$$

In Formula 1, A, B, C, and D represent constants, Jmn represents a Bessel function, and m (=0, 1, 2, ...) represents an order of the Bessel function. Further, n (n=1, 2, 3, ...) represents the n-th r at which the value of the Bessel function becomes zero (0). In Formula 2, T represents internal stress, p represents density, and h represents the thickness of the second region 12.

The amount of displacement in along the Z-axis is zero over the entire time t because the periphery of the second region 12 is fixed. For the primary resonance, the amount of displacement is not zero at any point on the second region 12 except the periphery. In the primary resonance, the diameter of a corresponds to the first zero point in the Bessel function.

The value of the zero point in the Bessel function is determined in advance. The first point is 2.405, and the second point is 5.520. The value of the Bessel function at any position r (r≤a) in the first resonance is obtained by substituting the time t determined by the dimensions, stress information, resonance frequency of the second reflector 121 into the above Formula 1: u (r, φ, t) to estimate the amount of displacement of the second reflector 121 per unit time during resonance.

FIG. 6 is an illustration of resonant oscillation of the second region 12. The resonator length changes with the position of the second reflector 121 along the Z-axis in the second reflector 121. With a change in resonator length, the wavelength of a laser beam emitted from the light emitter 211 changes.

To linearly change the wavelength of a laser beam emitted from the light emitter 211 with drive voltage applied to the piezoelectric element 122, the drive voltage is determined based on the amount of displacement per unit time, which is determined by the dimension and frequency of the second region 12.

In some examples, the wavelengths of the laser beams are changed by oscillating the second region 12 at frequencies sufficiently far from the resonance frequency. This is advantageous in that the wavelengths of the laser beams are changed at various frequencies: using the frequencies significantly different from the resonance frequency allows the amount of displacement to remain significantly unchanged with changes in frequency although a great amount of displacement like the resonant actuation is not obtained.

For the linear relation between the drive voltage and the amount of displacement of the second reflector 121, the drive voltage linearly changes with time, and the amount of displacement of the second region 12 also linearly changes with time. Using that linear relation between the drive voltage and the amount of displacement facilitates adjustment of the wavelengths of the laser beams unlike using the resonant actuation.

Figure 7:
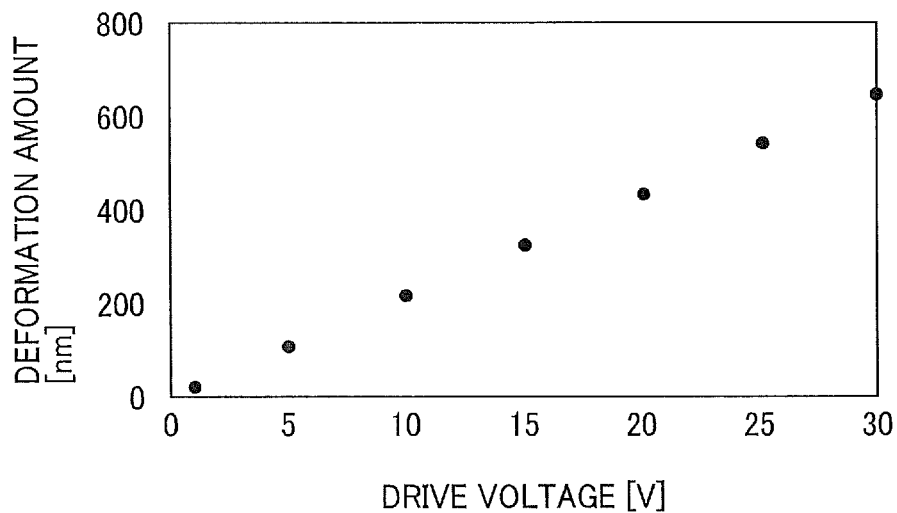
FIG. 7 is a graph of the relation between drive voltage and the amount of displacement of a second reflector, according to an embodiment.

FIG. 7 is a graph of the relation between drive voltage of the piezoelectric element 122 and the amount of displacement of the second reflector 121, according to an embodiment. In FIG. 7, a linear relation exists between the drive voltage of the piezoelectric element 122 and the amount of displacement of the second reflector 121.

Figure 8:
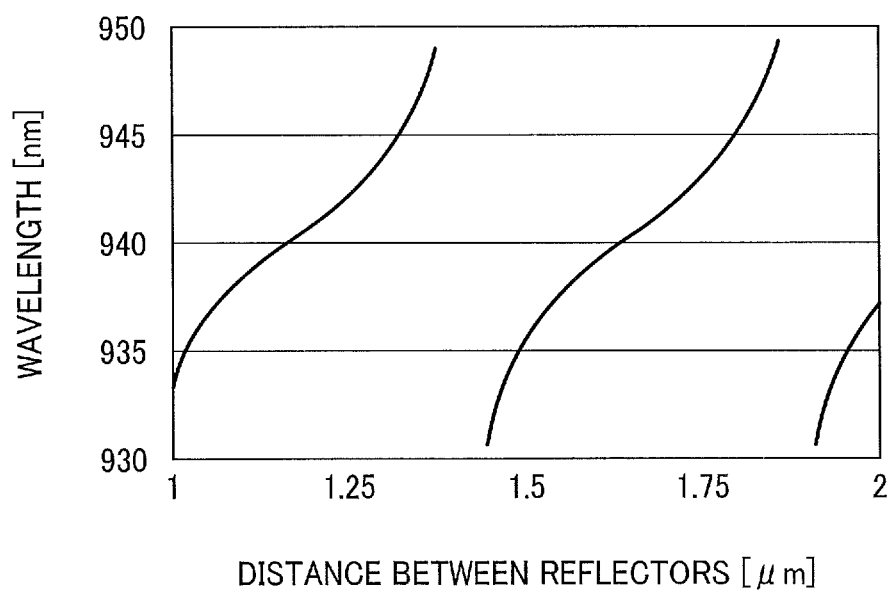
FIG. 8 is a graph of the relation between wavelength and the distance between reflectors, according to an embodiment.

FIG. 8 is a graph of the relation between the wavelength of a laser beam emitted from the light emitter 211 and the distance between the first reflector 22 and the second reflector 121, according to an embodiment. In FIG. 8, the wavelength of a laser beam emitted from the light emitter 211 increases as the distance between the first reflector 22 and second reflectors 121 (i.e., the resonator length) increases. The wavelength of a laser beam emitted from the light emitter 211 decreases as the resonator length decreases.

The linearity of the wavelength of the laser beam over time is determined by, for example, the linearity of the amount of displacement of the second reflector 121 along the Z-axis with respect to drive voltage applied to the piezoelectric element 122 and the linearity of the wavelength of the laser beam with respect to the resonator length. With a linear relation between the drive voltage and the amount of displacement of the second reflector 121 along the Z-axis, the resonator length linearly changes with the drive voltage.

In FIG. 8, changes in the distance between the reflectors within the range, in which the wavelength of the laser beam relatively linearly changes with the distance between the reflectors, enables a linear change in the wavelength of the laser beam with the drive voltage.

Further, using frequencies significantly different from the resonance frequency to actuate the second region 12 produces a substantially linear relation between the drive voltage and the amount of displacement of the second reflector 121. In view of the above description, selecting the range in which the wavelength of the laser beam linearly changes with the distance between the reflectors enables a linear change in the wavelength of the laser beam over time.

The following describes the operational effects of the light source device 1.

Conventionally, a wavelength variable laser used as a light source of a frequency modulated continuous wave light detection and ranging (FMCW LiDAR) device is known. Such a wavelength variable laser includes: an optical resonator including a first mirror and a second mirror; a gain region between the first mirror and the second mirror; and an electrostatically-actuated micro-electromechanical systems (MEMS) actuator. The MEMS actuator regulates air gap between the first mirror and the second mirror.

However, the electrostatic actuation enables determination of the amount of displacement and the speed of actuation (i.e., the resonance frequency) based on a balance between an electrostatic attractive force between parallel flat plates sandwiching the air gap and a restoring force of the movable portion connected to the parallel flat plates.

For example, assuming that one of the parallel flat plates is fixed to the fixed portion and the other is connected to the support through the movable portion, the electrostatic attractive force depends on the area W of the parallel flat plate, the vacuum dielectric constant $\varepsilon$, the drive voltage V, and the displacement amount x, and the spring restoring force depends on the spring constant k and the displacement x. In response to application of drive voltage, a displacement x is obtained to balance the electrostatic attractive force against the spring restoring force.

The resonance frequency f of the parallel flat plate is given by using a spring constant k, a constant c, and a mass m of the parallel flat plate. Under the relation between the area W of the parallel flat plate, the resonance frequency f, the vacuum dielectric constant $\varepsilon$, the drive voltage V, the spring constant c, and the displacement amount x, the displacement amount x decreases and the resonance frequency increases with increasing spring constant k. Further, the mass m is given by the product of the area W, the thickness h, and the density p.

It can be found from the above-described relations that a smaller density, a smaller thickness, and a higher drive voltage are to be obtained to shift a curve indicating the relation between the resonance frequency and the displacement amount, which are limited by the spring constant, to increase the speed (i.e., a higher frequency) and the amount of displacement.

For example, if other variables are fixed, the density, the thickness, and the voltage are to be $\frac{1}{100}$, $\frac{1}{100}$, and 10 times as great, respectively, to decuple the resonance frequency.

Further, new material is to be developed to reduce the density to $\frac{1}{100}$, and new material is alto to be developed to reduce the thickness of the movable portion. Development of such materials is not easy. Further, the increase in the drive voltage may be limited by specifications such as the size, operation reliability, and power consumption of an optical device, including a light source device.

As described above, the electrostatic actuation has difficulties in actuating the parallel plates at high speeds with greater amount of displacement to change the resonator length. Its challenge is in changing the wavelength of the laser beam over a wide range of wavelength at high speeds.

In view of such circumstances, the light source device according to an embodiment includes the light emitter 211, the first reflector 22, the second reflector 121, the base 10, and the piezoelectric element 122 (or a piezoelectric body).

The first reflector 22 and the second reflector 121 face each other with the light emitter between the first reflector 22 and the second reflector 121. With a space between the light emitter 211 and the second reflector 121, the base 10 supports the second reflector 121. The piezoelectric element 122 deforms in response to application of drive voltage. The base 10 includes a first region 11 and a second region 12 having a lower stiffness than the first region 11. The second reflector 121 and the piezoelectric element 122 are in the second region 12. The piezoelectric element 122 deforms the second region 12 to drive the second reflector 121 to displace. The displacement of the second reflector 121 changes the distance between the first reflector 22 and the second reflector 121. The light source device 1 emits a laser beam whose wavelength is changeable with the distance between the first reflector 22 and the second reflector 121.

The stiffness changes with factors including dimensions (lengths and thicknesses) of objects and elastic moduli of materials constituting the objects. In the present embodiment, the second region 12 has a lower thickness than the first region 11 to allow the first region 11 to have a relatively high stiffness and the second region 12 to have a relatively low stiffness. The resonant frequency of the movable portion is determined by its dimensions and the mechanical properties of the material of the movable portion. If the constituent material is constant, the spring constant decreases as the size of the movable portion increases, and the resonance frequency that is proportional to the spring constant decreases. However, when the support having a higher stiffness than the movable portion is provided around the movable portion, the substantial fixed end of the movable portion approximates to an area at and around the boundary between the low-stiffness region and the high-stiffness region. In other words, the area at and around the boundary between the first region 11 and the second region 12 becomes a substantially fixed end of the second region 12. Further, using the first region 11 made of material having a higher stiffness than the second region 12 eliminates the need to increase the thickness of the first region 11, and enables a relatively high-stiffness first region 11 and a relatively low-stiffness second region 12.

In the above-described embodiment, the base 10 includes a low-stiffness area and a high-stiffness area. In some examples, the base 10 includes no high-stiffness area (e.g., the silicon active layer 113), and an area where a low-stiffness layer (e.g., the silicon active layer 113) is connected to the joint 13 provides a high-stiffness area serving as the fixed end of the movable portion. In this case, the size of the base 10 is to be reduced sufficiently to prevent a decrease in spring constant and maintain the mechanical strength of the movable portion having a low stiffness.

The piezoelectric element 122 drives the second reflector 121 to change the resonator length, which corresponds to the distance between the reflectors 22 and 121. The light emitter 211 emits a laser beam whose wavelength is changeable with the resonator length.

The piezoelectric element 122 deforms the thin second reflector 121, the deformation of the thin second reflector 121 drives the second reflector 121. In this configuration, driving the second reflector 121 at high speeds and with a great amount of displacement changes the resonator length. For example, the second reflector 121 can be driven at a driving speed of 1 MHz or higher and with an amount of displacement of 200 nm or greater. This enables changes in the wavelengths of the laser beams over a wide wavelength range at high speeds.

Figure 9A:
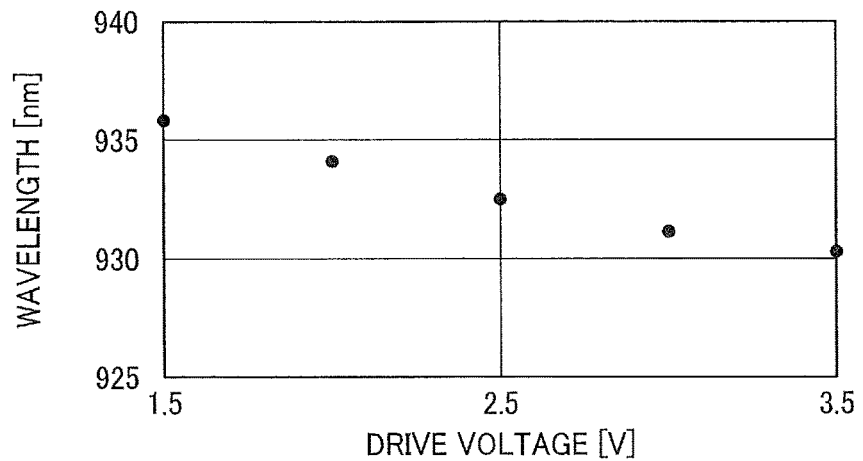
FIGS. 9A, 9B, and 9C are graphs of the relation between drive voltage applied to a piezoelectric element and wavelength of a laser beam emitted from the light source device in FIGS. 1A and 1B.
Figure 9B:
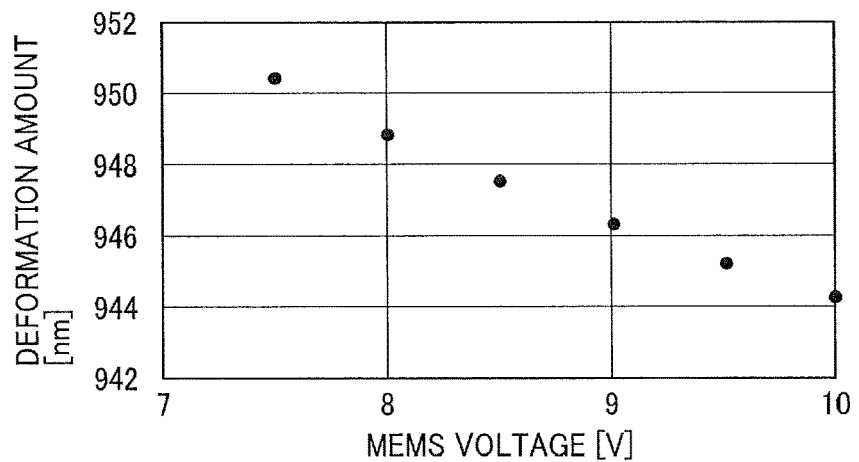
Figure 9C:
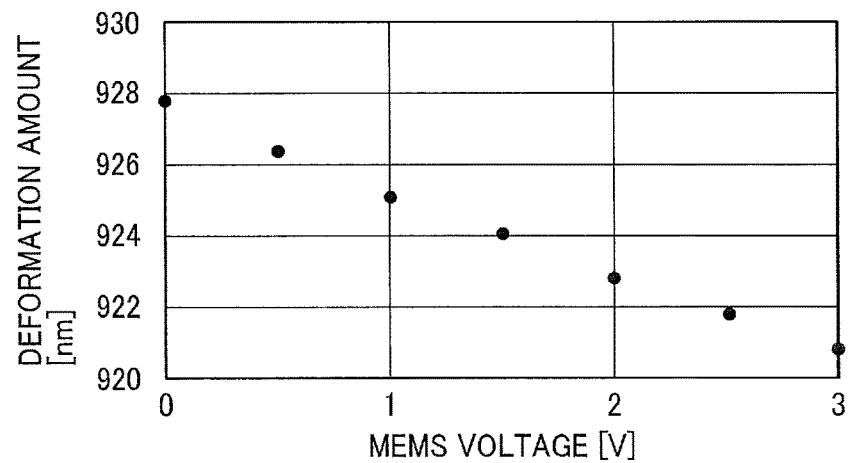

FIGS. 9A, 9B, and 9C are graphs of the relation between drive voltage applied to the piezoelectric element 122 and the wavelength of a laser beam emitted from the light source device 1. For example, a tunable laser beam emitted from the light source 1 has a wavelength band ranging from 920 nm to 950 nm, and a drive voltage applied to the piezoelectric element 122 is below 5 V. Since the amount of deformation of the piezoelectric element 122 (i.e., the amount of change in the volume of the piezoelectric element 122) linearly changes with the drive voltage, the amounts of displacement of the second region 12 and the second reflector 121 along the Z-axis substantially linearly change with the deformation of the piezoelectric element 122. To allow a substantially linear change in the wavelength of a laser beam emitted from the light source device 1 with the drive voltage applied to the piezoelectric element 122, the second reflector 121 is to be displaced with wavelengths in and around the range in which the oscillation wavelength substantially linearly changes with the distance between the reflectors, or the resonator length (e.g., with oscillation wavelengths close to or of 940 nm in FIG. 8).

The volume of a voltage-signal source is to be reduced to reduce the sizes of the light source device 1 and other devices mounted on the light source device 1. The volume of a voltage-signal source usually increases as voltage and its modulation speed increase. Further, the volume of a voltage-signal source, which additionally serves to correct non-linearity of wavelengths, increases more. The light source device 1 allows an approximately linear change in wavelength with drive voltage and enables changes in wavelength with a low drive voltage over a wide wavelength range, which is sufficient to achieve intended performance. Such a light source device 1 achieves a compact tunable-laser light source that emits a light beam whose wavelength is adjustable at a speed of MHz order.

In the present embodiment, the piezoelectric element 122 is provided in an annular shape around the second reflector 121 in the second region 12. This arrangement allows a uniform distribution of driving force over the second reflector 121 in an inward direction from outside the second reflector 121, and facilitates adjustment of displacement of the second reflector 121.

In the above-described embodiments, the piezoelectric element 122 is on the surface included in the second region 12 and facing the light emitter 211. However, this is only one example.

FIGS. 10A and 10B are enlarged cross-sectional views of configurations of a second region 12 and its surroundings according to variations of an embodiment. FIG. 10A is an illustration of a configuration of a second region 12 and its surroundings according to a first variation of an embodiment. FIG. 10B is an illustration of a configuration of a second region 12 and its surroundings, according to a second variation of an embodiment.

In FIG. 10A, a light source device 1a according to the first variation includes the second region 12 between the second reflector 121 and the piezoelectric element 122 (i.e., the piezoelectric element 122 is at the opposite side of the second region 12 from the second reflector 121), with the second reflector 121 overlapping with the piezoelectric element 122. This configuration eliminates a restriction on the area of the piezoelectric element 122 due to the second reflector 121, and thus allows an increase in the area of the piezoelectric element 122. Increasing the area of the piezoelectric element 122 increases stress generated by the piezoelectric element 122, and allows the second reflector 121 to displace more significantly.

In FIG. 10B, a light source device 1b according to the second variation includes a piezoelectric element 122 on the −Z-surface of the second region 12 and a second reflector 121 overlapped on the −Z-surface of the piezoelectric element 122. This configuration, in which the piezoelectric element 122 and the second reflector 121 are on one side of the second region 12, also eliminates a restriction on the area piezoelectric element 122 due to the second reflector 121 and thus allows an increase in the area of piezoelectric element 122. This configuration further eliminates the need for forming a film on each side of the second region 12.

Unlike FIG. 10B in which the piezoelectric element 122 and the second reflector 121 are on the −Z-surface of the second region 12 (i.e., downstream of the second region 12 in the −Z direction), the piezoelectric element 122 and the second reflector 121 may be on the +Z-surface of the second region 12 (i.e., downstream of the second region 12 in the +Z-direction).

Figure 11:
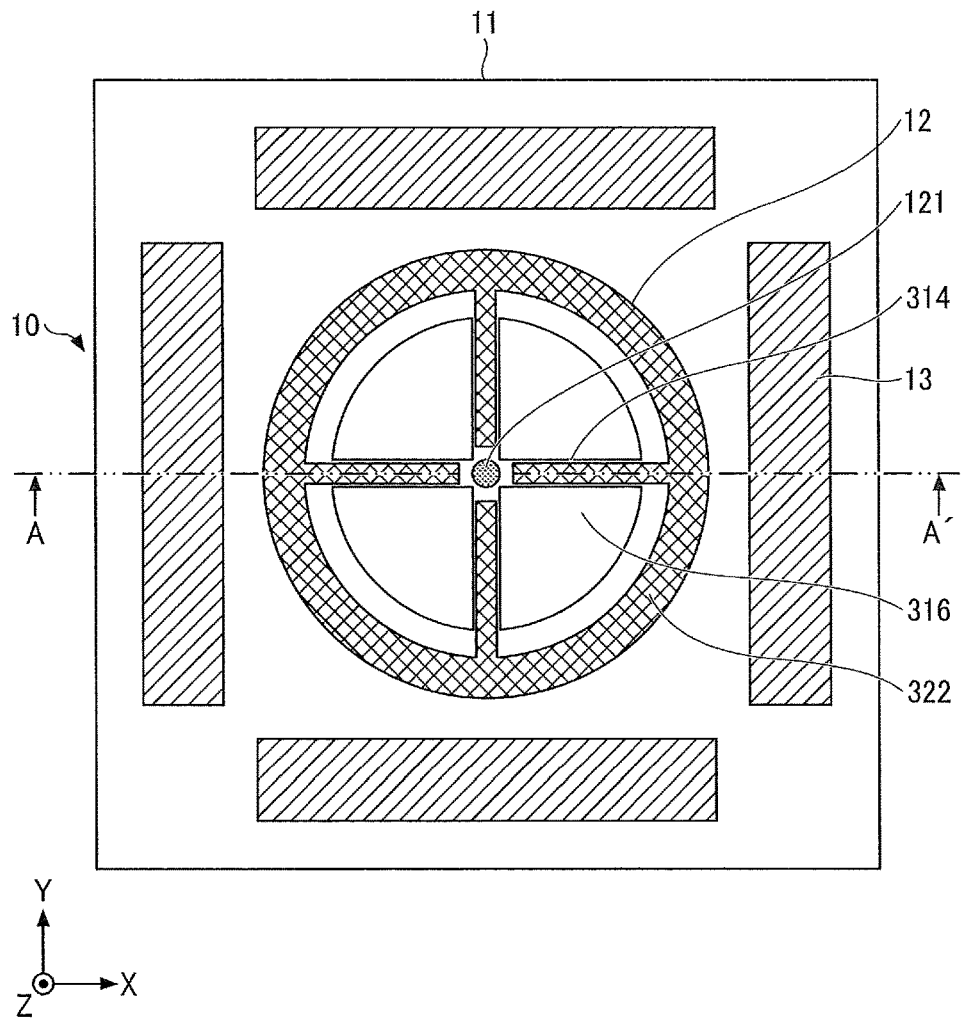
FIG. 11 is a plan view of a base according to a first variation of an embodiment.
Figure 12:
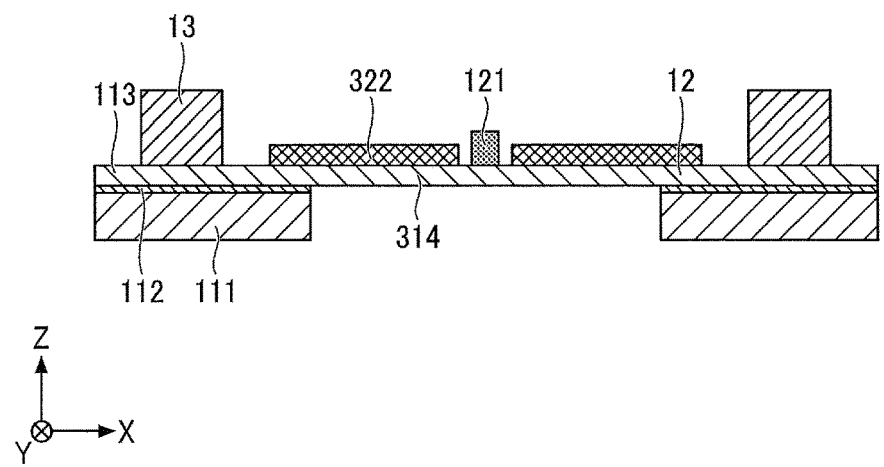
FIG. 12 is a cross-sectional view taken along line A-A' in FIG. 11.

FIGS. 11 and 12 are illustrations of a base 10 according to a first variation of an embodiment.

FIG. 11 is a plan view of the base 10 according to the first variation. FIG. 12 is a cross-sectional view taken along line A-A' in FIG. 11.

As illustrated in FIGS. 11 and 12, the second region 12 of the base 10 includes multiple movable beams 314 connecting the second reflector 121 and the first region 11. The movable beam 314 may not have a linear shape, and may be curved or partly bent. Further, the multiple movable beams 314 include two or more movable beams 314. The two or more movable beams 314 are preferably disposed so as to be rotationally symmetrical. This facilitates driving of the second reflector 121 to displace along the Z-axis while maintaining parallelism between the second reflector 121 and the first reflector 22.

Each movable beam 314 is formed by removing the support layer 111, the oxide insulating layer 112, and the silicon active layer 113 in a region 316 through the semiconductor processing, including dry etching. The region 316 is surrounded by the first region 11. Similarly to the movable beams 314, through the semiconductor processing, the piezoelectric element 322 is formed on the movable beams 314 of the second region 12 and on a portion of the first region 11, which is a peripheral area of the region 316. The spring constant of the movable beams 314 is changed by adjusting the dimension of the movable beam 314 to set the relation between the resonance frequency of the second reflector 121 and the amount of displacement of the second reflector 121 along the Z-axis during resonance.

The base 10 according to the present variation includes the piezoelectric element 322 on the movable beams 314 and on the peripheral area of the region 316. Simultaneously applying voltage to the entirety of the piezoelectric element 322 on both the movable beams 314 and the peripheral area of the region 161a increases the amount of displacement of the second reflector 121 along the Z-axis during resonance. With a change in the volume of the piezoelectric element 322 on the movable beams 314 in response to application of voltage, the movable beams 314 on which the piezoelectric element 322 is provided deform, and the deformation of the movable beams 314 moves, or displaces the second reflector 121 (i.e., the deformation of the movable beams 314 changes the position of the second reflector 121). For example, applying a sinusoidal voltage to the piezoelectric element 322 on the movable beams 314 sinusoidally displaces the second reflector 121 along the Z-axis over time. For another example, applying a voltage signal with a frequency equal to or close to the resonance frequency of the movable beams 314 to the piezoelectric element 322 allows the movable beams 314 to undergo excitation to thus exhibit a resonance phenomenon. The occurrence of the resonance phenomenon allows a greater amount of displacement of the second reflector 121 than a non-resonance status.

Further, applying, to the piezoelectric element 322 in the peripheral area of the region 316, the same sinusoidal voltage signal as that of the piezoelectric element 322 on the movable beams 314 deforms the silicon active layer 113 near the peripheral area of the region 316 with a smaller amount of displacement than the movable beams 314. When the oscillation caused by the deformation of the silicon active layer 113 is transferred to the movable beams 314 mechanically connected to the peripheral area of the region 316, the movable beams 314 are excited to exhibit the resonance phenomenon. Using contraction and expansion of the piezoelectric element 322, the movable beams 314, which is to receive a greater amount of displacement at a higher speed, and the peripheral area mechanically connected to and surrounding the movable beams 314 are deformed to move, or displace the second reflector 121 on the movable beams 314 at high speeds and with a greater amount of displacement.

Figure 13:
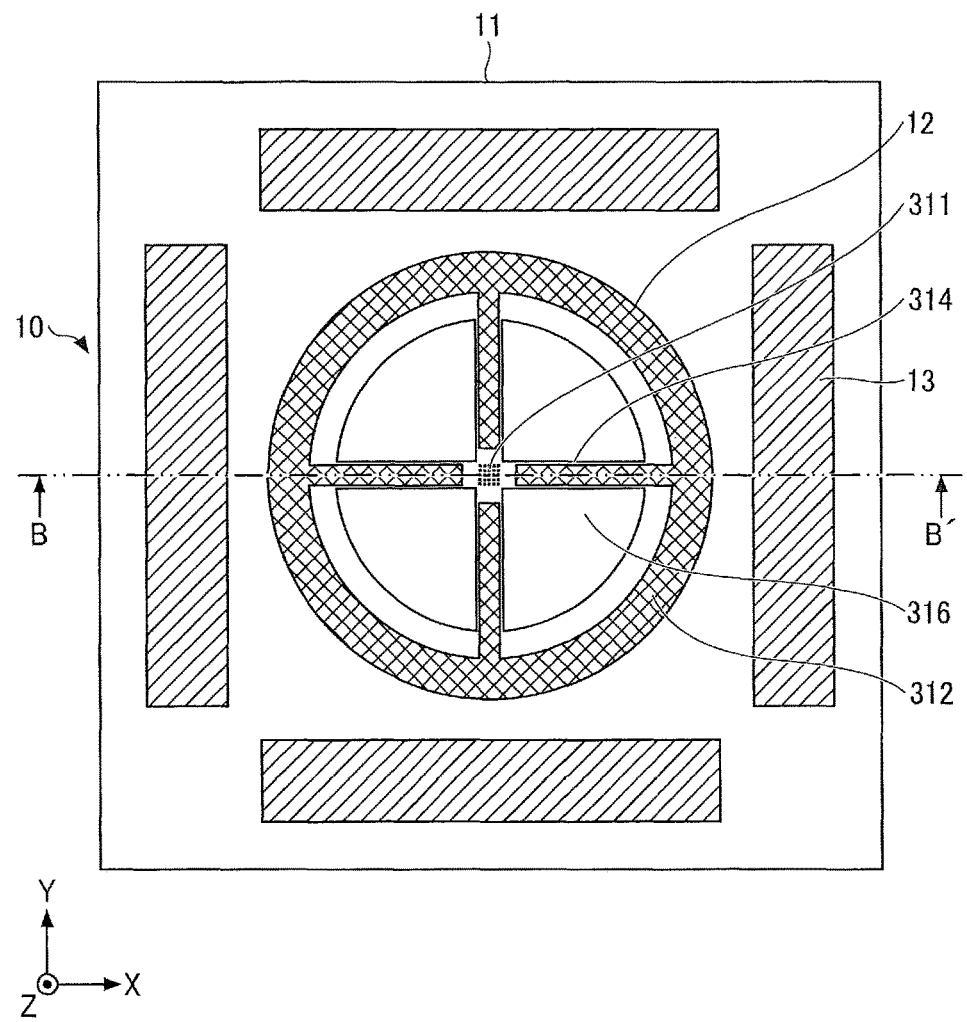
FIG. 13 is a plan view of a base according to a second variation of an embodiment.
Figure 14:
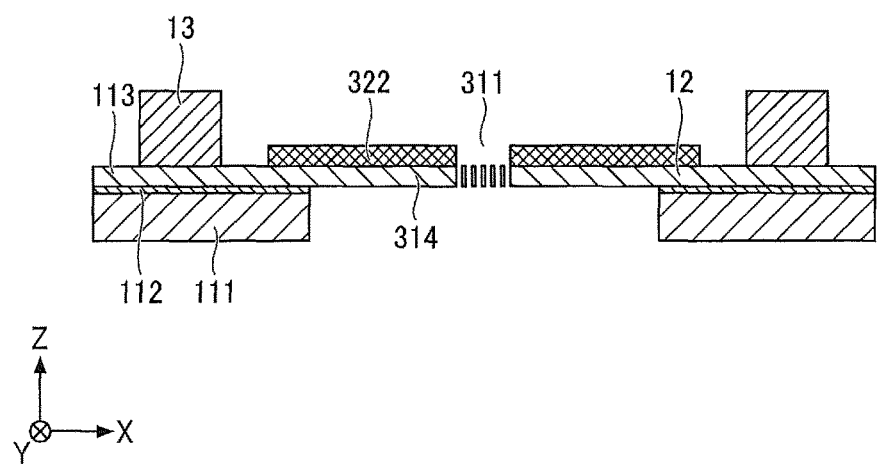
FIG. 14 is a cross-sectional view taken along line B-B' in FIG. 13.

FIGS. 13 and 14 are illustrations of a base 10 according to a second variation of an embodiment. FIG. 13 is a plan view of the base 10 according to the second variation. FIG. 14 is a cross-sectional view taken along line B-B' in FIG. 13.

In the second variation as illustrated in FIGS. 13 and 14, the second variation include, as the second reflector 121, a reflector 311 having a high contrast grating (HCG) that servers to ensure its reflectivity. The reflector 311 has holes periodically formed on a portion of the silicon active layer 113. The resonance frequency of the movable beams 314 is commonly inversely proportional to its mass. The reflector composed of a multilayer reflector or a metal thin film, in which multiple thin films are overlaid on top of another, has a large mass. In contrast, the reflector 311 having the HCG of a single silicon layer according to the present variation achieves the reflectivity equivalent to that of the second reflector 121 according to the first variation. Thus, the use of the reflector 311 as the second reflector 121 achieves a higher resonance frequency. Notably, the material of the HCG reflector is not limited to silicon, and may be any material having a refractive index different from the refractive index of the space through which light propagates. In the second variation, the second reflector 121 according to the first variation is replaced by a reflector 311 having an HCG. In some examples, the second reflector 121 according to the first embodiment may be replaced by a reflector 311 having have the HCG.

Figure 15:
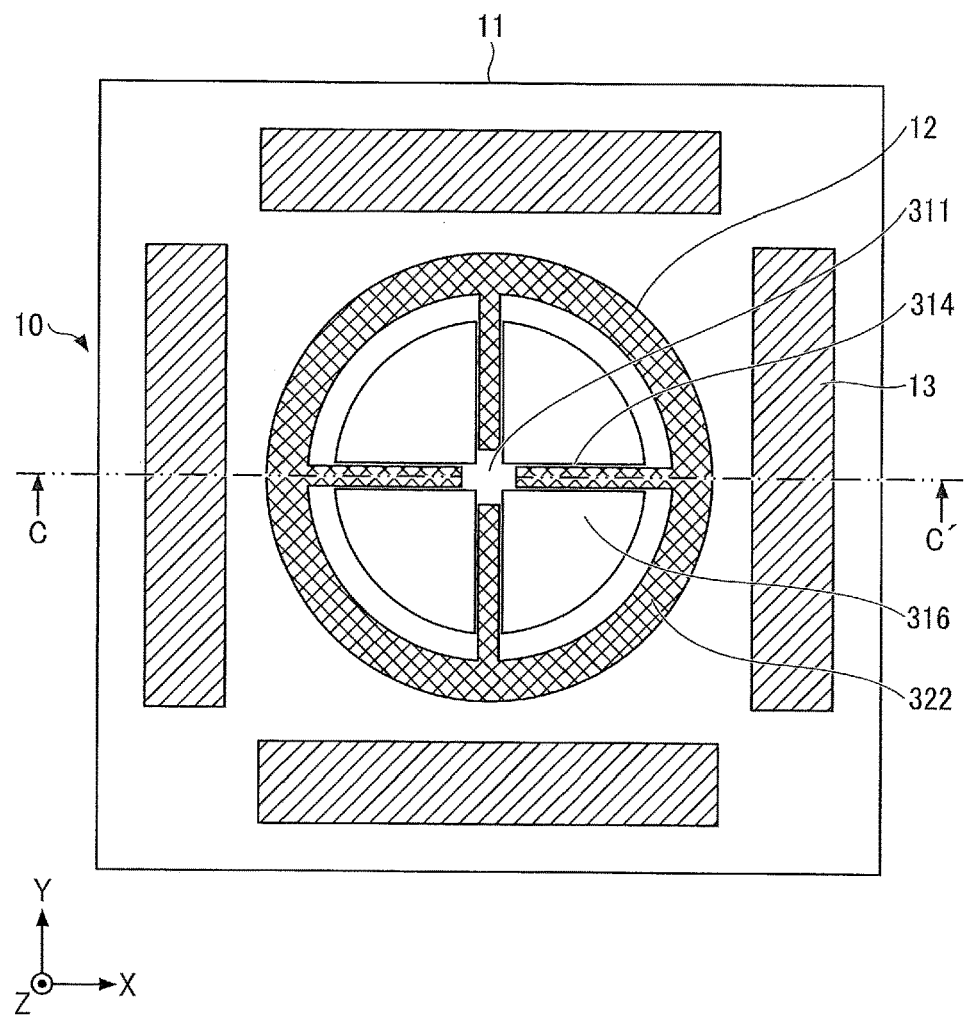
FIG. 15 is a plan view of a base according to a third variation of an embodiment.
Figure 16:
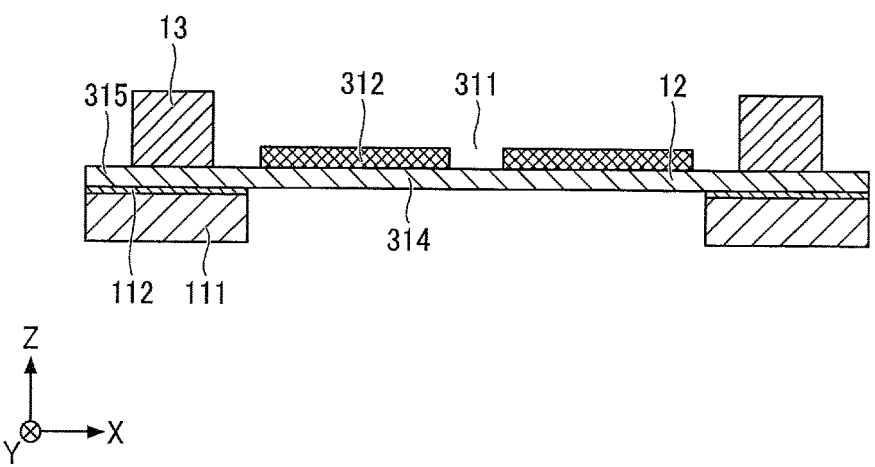
FIG. 16 is a cross-sectional view taken along line C-C' in FIG. 15.

FIGS. 15 and 16 are illustrations of a base 10 according to a third variation of an embodiment. FIG. 15 is a plan view of the base 10 according to the third variation. FIG. 16 is a cross-sectional view taken along line C-C' in FIG. 15.

As illustrated in FIGS. 15 and 16, the third variation differs from the first variation in that the movable beams 314 is made of a multilayer-film reflector 315 instead of the silicon active layer 113. In the second variation, the reflector 311 includes an HCG in the movable beams 314 of the silicon active layer 113. In contrast, the second reflector 121 is composed of the multilayer-film reflector 315 substituted for the movable beams 314. The reflector composed of the multilayer film mirror or the metal thin film involves forming a reflector on the silicon active layer 313, whereas the HCG reflector involves forming an HGC periodic structure on the silicon active layer 313. However, in the present variation, a single structure enables both movement of the multilayer-film reflector 315 and reflection of light, which eliminates the needs for processing the element.

Further, the emission direction of the tunable laser beam emitted from the light source device 1 can be selected by adjusting the number of layers of the multilayer film to control its reflectivity. For example, the light source device with the base 10 according to any one of the first variation and the second variation is not to emit a laser beam having a wavelength in an absorption band of the silicon active layer 113 through the silicon active layer 113. However, the light source device with the base 10 according to the present variation, which includes no silicon active layer 113, allows the second reflector 121 to emit a laser beam even having a wavelength in the absorption band of the silicon active layer 113 in the direction 31 in FIG. 1B. Notably, in the third variation, the silicon active layer 113 constituting the movable beams 314 according to the first variation is the multilayer-film reflector 315. Alternatively, the silicon active layer 113 according to the first embodiment may be a multilayer-film reflector.

In the first variation to the third variation, at least two movable beams 314 are included as a part of the second region 12. For example, the movable beam 314 has a width of 1 μm to 100 μm in the shorter-side direction, a length of 10 μm to 1000 μm in the longer-side direction, and a thickness of 50 μm to 100 μm in the thickness direction. The movable beam 314 having such dimensions enables a higher resonance frequency (e.g., above 1 MHz) and a greater wavelength sweep width while achieving a reduction in the size of the device.

Second Embodiment

Next, a light source device 1c according to a second embodiment will be described. Like reference signs denote like elements as in the first embodiment, and overlapping description is omitted. The same applies to the following embodiments and variations described below.

Figure 17:
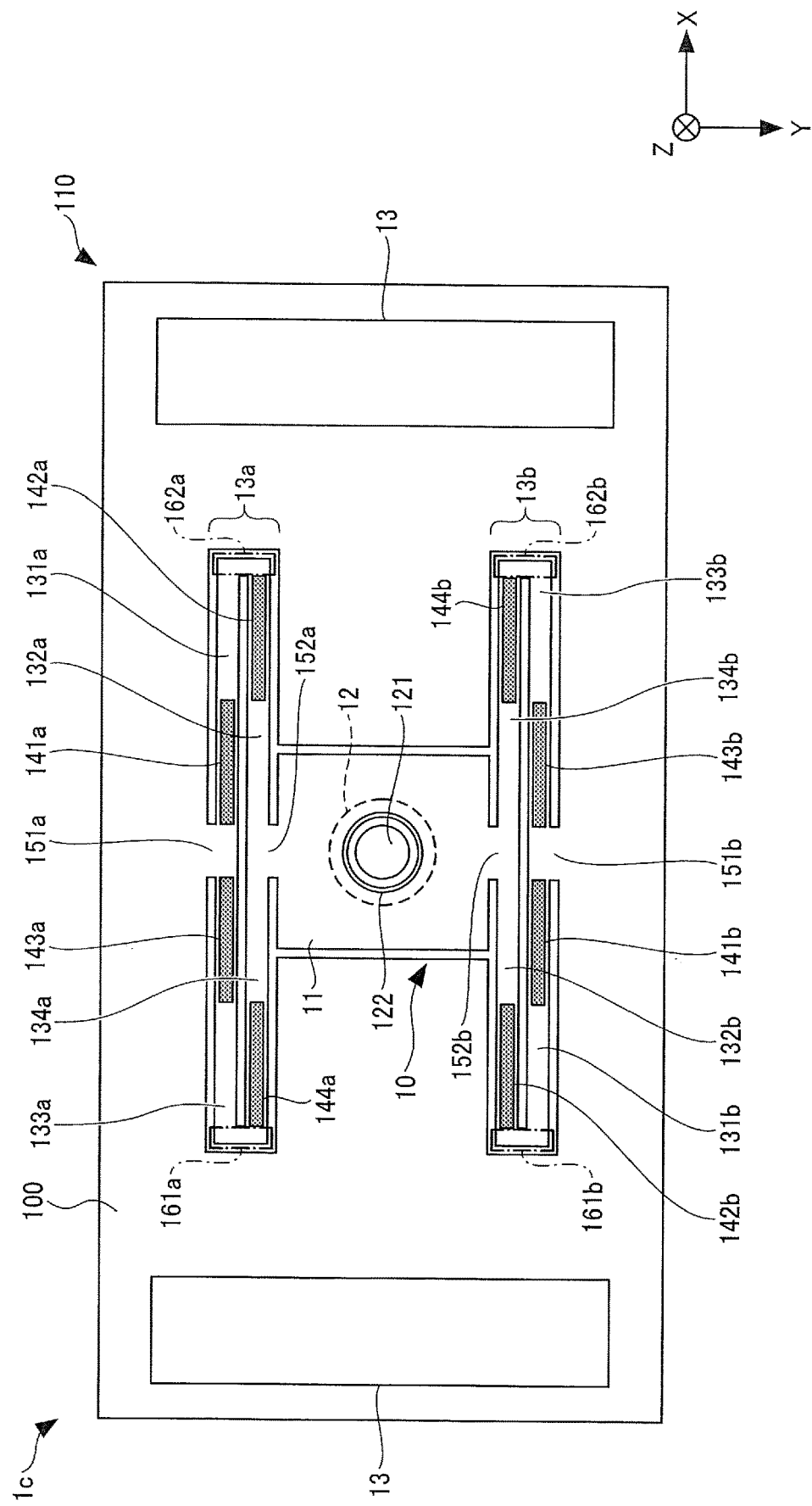
FIG. 17 is a plan view of a configuration of a light source device according to a second embodiment.

FIG. 17 is a plan view of an exemplary configuration of a light source device 1c. In FIG. 17, the light source device 1c includes a second base 110 supporting the base 10, which differs from the first embodiment. The second base 110 includes a second support 100 and second movable portions 13a, and 13b. The second support 100 is an example of a third region, and the second movable portions 13a and 13b are examples of a fourth region.

The second movable portion 13a has a meandering structure, in which adjacent ends 162a of the movable beam 131a and the movable beam 132a are couple to each other, and adjacent ends 161a of the movable beam 133a and the movable beam 134a are coupled to each other. One end of the second movable portion 13a is coupled to the second support 100 through a first coupling portion 151a, and the other end of the second movable portion 13a is coupled to the base 10 through a second coupling portion 152a. Each of the movable beams 131a, 132a, 133a, and 134a is an example of a beam.

The movable beam 131a, 132a, 133a, and 134a includes piezoelectric elements 141a, 142a, 143a, and 144a on their −Z-surfaces, respectively. Each of the piezoelectric elements 141a, 142a, 143a, and 144a is an example of a base driver.

Each of the piezoelectric elements 141a, 142a, 143a, and 144a deforms (e.g., contracts) with a drive voltage applied thereto through electrodes on the second support 100. The movable beams 133a and 134a are elastically deformed by the deformation of the piezoelectric elements 141a and 142a, and the movable beams 131a and 132a are elastically deformed by the deformation of the piezoelectric elements 143a and 144a.

Further, the second movable portion 13b has a meandering structure, in which the movable beam 131b and the movable beam 132b are coupled to each other at their ends 161b, and the movable beam 133b and the movable beam 134b are coupled to each other at their ends 162b. One end of the second movable 13b is coupled to the second support 100 through a first coupling portion 151b, and the other end of the second movable portion 13b is coupled to the base 10 through a second coupling portion 152b. Each of the movable beams 131b, 132b, 133b, and 134b is an example of a beam.

The movable beams 131b, 132b, 133b, and 134b include piezoelectric elements 141b, 142b, 143b, and 144b on the −Z-surfaces of the movable beams 131b, 132b, 133b, and 134b along the Z-axis. Each of the piezoelectric elements 141b, 142b, 143b, and 144b is an example of a base driver.

Each of the piezoelectric elements 141b, 142b, 143b, and 144b deforms (e.g., contracts) with a drive voltage applied thereto through electrodes on the second support 100. The movable beams 131b and 132b are elastically deformed by the deformation of the piezoelectric elements 141b and 142b, and the movable beams 133b and 134b are elastically deformed by the deformation of the piezoelectric elements 143b and 144b.

The movable beams 131a, 132a, 133a, 134a, 131b, 132b, 133b, and 134b are thinner and stiffer than the first region of the base 10 and the second support 100. This configuration allows an area in and around each of the first coupling portion 151a and the second coupling portion 152a to be substantially a fixed end of the second movable portion 13a, and also allows an area in and around each of the first coupling portion 151b and the second coupling portion 152b to be substantially a fixed end of the second movable portion 13b.

When the amount of displacement of the second movable portion 13a is equal to the amount of displacement of the second movable portion 13b, the base 10 is translationally moved by that amount of displacement along the Z-axis. When the amount of displacement of the second movable portion 13a is different from the amount of displacement of the second movable portion 13b, the base 10 is caused to tilt along the Y-axis.

For example, when the amount of displacement of the second movable portion 13a is smaller than the amount of displacement of the second movable portion 13b, the −Y-end portion of the base 10 is displaced by a relatively small amount in the −Z-direction, and the +Y-end portion of the base 10 is displaced by a relatively large amount in the −Z-direction. This causes the base 10 to tilt along the Y-axis.

FIG. 17 is a side view of the base 10, on which the second reflector 121 is provided. The VCSEL device 20 is assumed to be disposed downstream of the second support 100 in the −Z-direction and connected to the second support 100 through the joint 13.

In the light source device 1 according to the first embodiment, the distance along the Z-axis between the VCSEL device 20 and the base 10 might vary in each manufactured light source device 1. If the distance along the Z-axis between the VCSEL device 20 and the base 10 deviates from a desired distance between the reflectors, a laser beam having a desired wavelength may not be obtained.

The correction of the distance between the reflectors by adjusting the distance between the VCSEL device 20 and the base 10 during the joining operation takes time and effort.

For example, applying an offset drive voltage to the piezoelectric element 122 to translationally move the second reflector 121 along the Z-axis so as to correct the distance between the reflectors restricts the amount of the translational movement of the second reflector 121 along the Z-axis, and may fail to completely correct the distance between the reflectors, which significantly deviates from a desired value.

To change the distance between the VCSEL device 20 and the base 10 to correct the distance between the reflectors, the present embodiment applies bias voltage to the piezoelectric elements 141a, 142a, 143a, 144a, 141b, 142b, 143b, and 144b of the second movable portions 13a and 13b to deform the movable portions 13a and 13b to drive the base 10 along the Z-axis. This configuration eliminates the needs for adjusting (correcting) the distance between the VCSEL device 20 and the base 10 and facilitates correction of the distance between the reflectors.

The second movable portion 13a and the 13b each having a meander structure enable a more significant displacement of the base 10 than the driving of the piezoelectric element 122 to move the second reflector 121. The configuration of the present embodiment enables correction of the distance between the reflectors, which even significantly displaces from a desired distance between the reflectors.

For the base 10 tilted relative to the VCSEL device 20, the base 10 is caused to tilt by the deformation of the second movable portions 13a and 13b to change the tilt angle of the base 10 relative to the VCSEL device 20 so as to correct the distance between the reflectors. In some examples, the distance between the reflectors is corrected by changing both the distance between the VCSEL device 20 and the base 10 and the tilt angle of the base 10 relative to the VCSEL device 20.

In the light source device 1c, the second reflector 121 and the base 10 may be driven separately. In this case, a drive voltage whose waveform continuously and periodically changes with time (e.g., a sinusoidal waveform and a triangular waveform) is applied to the piezoelectric element 122 on the second region of the base while maintaining a bias voltage applied to the piezoelectric elements 122 of the second movable portions 13a, and 13b. This allows continuous modulation of the wavelength of a laser beam at high speeds. The central wavelength of the laser beam is adjusted while maintaining the range in which the wavelength continuously changes, by changing a bias voltage applied to the piezoelectric elements in the second movable portions 13a, and 13b. This is due to synergy between the second movable portions 13a and 13b that allows a significant change in the distances between the reflectors and the second region that allows sweep of wavelengths at high speeds. A typical electrostatic tunable laser has difficulties in simultaneously modulating the wavelength of the laser beam at high speeds in a continuous manner and modulating the central wavelength of the laser beam. This is because, the electrostatic driving unit drives the reflectors using an electrostatic attractive force uniformly acting between two surfaces facing each other with an air gap therebetween, and a portion to be driven or driving characteristics cannot be divided within a plane.

To separately drive the second reflector 121 and the base 10, the resonance frequency of the base 10 coupled to the second movable portions 13a and 13b through the first coupling portion 151a and the second coupling portion 152a, respectively is to be different from the resonance frequency of the second reflector 121 in the second region 12 by 50 Hz or greater. If the second reflector 121 is caused to oscillate with the resonance frequency of the second region 12, which is equal to the resonance frequency of the base 10 or with an absolute difference of below 50 Hz between the resonance frequency of the second region 12 and the resonance frequency of the base 10, the entirety of the base 10 including the second reflector 121 is excited by the oscillation of the second reflector 121, and the base 10 whose displacement is fixed by the bias voltage might be displaced. With a difference between the resonance frequency of the base 10 and the second movable portions 13a, and 13b and the resonance frequency of the second reflector 121 and the second region 12, noticeably of 50 Hz or greater, the wavelength of the laser beam is stably swept at high speeds while changing the central wavelength of the laser beam by changing the distance between the reflectors.

With the drive frequency greater for the second reflector 121 than for the base 10, the second region 12 is to have a higher stiffness than the movable beams 131a, 132a, 133a, 134a, 131b, 132b, 133b, and 134b of the second movable portions 13a, and 13b. Further, the weight is to be smaller for the second region 12 than for the second movable portions 13a, and 13b.

In the present embodiment, two second movable portions 13a, and 13b are incorporated in the light source device 1c. Alternatively, the light source device 1c may include three or more movable portions. Still alternatively, the second movable portions 13a and 13b may have a meander structure composed of three or more movable beams 131, instead of two movable beams 131a and 131b.

Third Embodiment

Next, a light source device 1c according to a second embodiment will be described.

Figure 18:
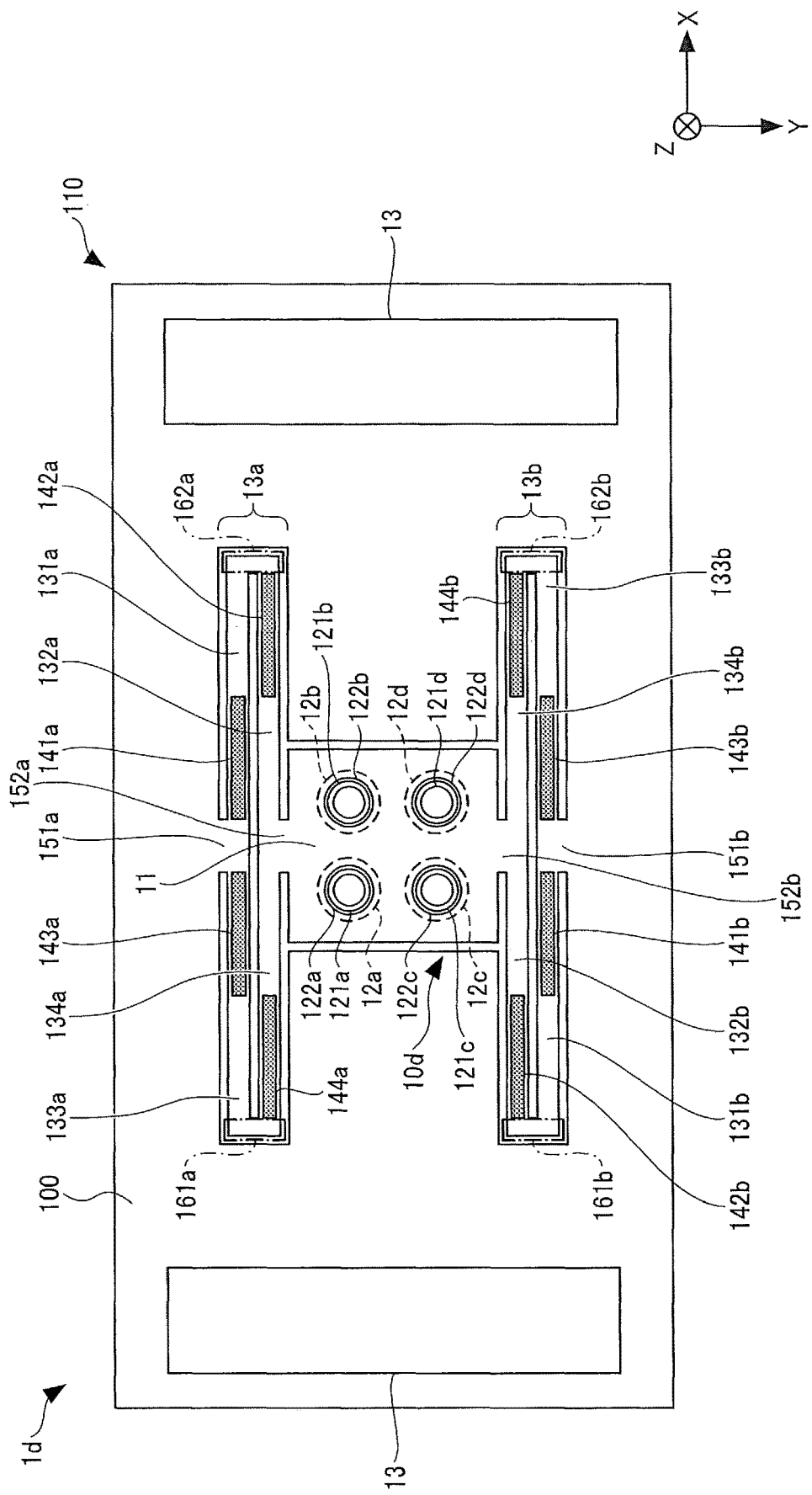
FIG. 18 is a plan view of a configuration of a light source device according to a third embodiment.

FIG. 18 is a plan view of an exemplary configuration of a light source device 1d. As illustrated in FIG. 18, the light source device 1d includes a base 10d, which is substituted for the base 10 of the light source device 1c according to the second embodiment. The base 10d includes four second regions 12a, 12b, 12c, and 12d. The four second regions 12a, 12b, 12c, and 12d are two-dimensionally arranged within the plane of the base 10d.

The second region 12a includes a second reflector 121a and a ring-shaped piezoelectric element 122a surrounding the second reflector 121a. The second region 12b includes a second reflector 121b and a ring-shaped piezoelectric element 122b surrounding the second reflector 121b. The second region 12c includes a second reflector 121c and a ring-shaped piezoelectric element 122c surrounding the second reflector 121c. The second region 12d includes a second reflector 121d and a ring-shaped piezoelectric element 122d surrounding the second reflector 121d.

The piezoelectric elements 122a, 122b, 122c, and 122d drive the second reflectors 121a, 121b, 121c, and 121d, independently of each other.

The second regions 12a, 12b, 12c, and 12d serve the same function as the second region 12, and the second reflectors 121a, 121b, 121c, and 121d serve the same function as the second reflector 121. The piezoelectric elements 122a, 122b, 122c, and 122d has the same configuration and serve the same function as those of the piezoelectric element 122.

FIG. 18 illustrates one side of the base 10d, on which the second reflectors 121a, 121b, 121c, and 121d are provided. The VCSEL device 20 is assumed to be disposed downstream of the second support 100 in the −Z-direction and connected to the second support 100 through the joint 13.

The VCSEL device 20 includes multiple light emitters 211 for the second reflectors 121a, 121b, 121c, and 121d, respectively. Each of the second reflectors 121a, 121b, 121c, and 121d and its corresponding first reflector 22 forms a resonator with a corresponding light emitter therebetween. Each light emitter 211 emits a laser beam having a wavelength according to the resonator length.

The light source device 1d in which multiple light emitters 211 emits light beams achieves an increase in the intensity of the laser beam to be emitted. In the light source device 1d, the multiple light emitters 211 are driven to emit light beams in a staggered manner. This configuration allows a shorter duration of light emission of each light emitter 211, and enables a reduction in heat generation due to the emission of laser beams, thus achieving a longer duration of light emission of the light source device 1d as a whole.

Fourth Embodiment

Figure 19:
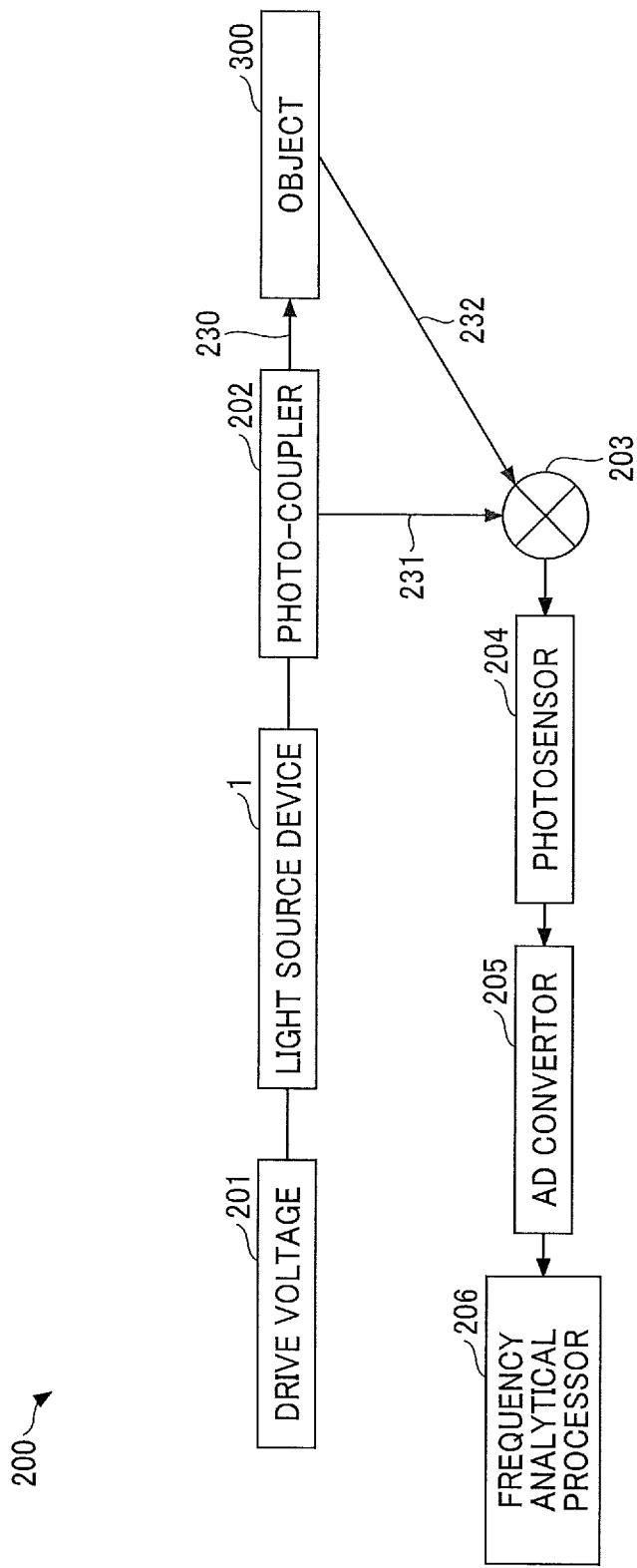
FIG. 19 is a block diagram of a configuration of a Light Detection and Ranging (LiDAR) device according to a fourth embodiment.

Next, a LiDAR device 200 according to a fourth embodiment will be described. FIG. 19 is a block diagram of a configuration of a LiDAR device 200 as an example of a distance measurement apparatus. The LiDAR device 200 is, for example, an FMCW LiDAR device that measures a distance to an object.

As illustrated in FIG. 19, the LiDAR device 200 includes a light source device 1, a photo-coupler 202, a light mixer 203, a photosensor 204, an analog-to-digital (AD) converter 205, and a frequency analytical processor 206.

The light source device 1 emits a tunable laser beam whose wavelength changes with a drive voltage. The photo-coupler 202 splits the tunable laser beam emitted from the light source device 1 into two light beams: a first light beam as an irradiation wave 230 and a second light beam as a reference wave 231, with a predetermined energy ratio. The photo-coupler 202 irradiates an object 300 with the first light beam as the irradiation wave 230, and directs the second light beam as the reference wave 231 to the light mixer 203.

The first light beam hitting the object 300 is reflected or scattered from the object 300 back to the light mixer 203, turning a return wave 232. The light mixer 203 superimposes the return wave 232 on the reference wave 231 to generate an interference wave.

The return wave 232 is delayed because of the distance to the object 300. For the object 300 moving relative to the LiDAR device 200, a frequency shift of a wave from such object 300 occurs because of the Doppler effect.

The photosensor 204 receives the interference wave generated by the light mixer 203 and outputs a voltage signal according to a light intensity of the interference wave. A voltage signal (beat signal) obtained from the interference wave generated by the light mixer 203 includes a frequency difference between the reference wave 231 and the return wave 232 and a frequency shift due to the Doppler effect.

The AD converter 205 A/D converts an analog voltage signal output from the photosensor 204, into a digital signal and outputs the digital signal to the frequency analytical processor 206. The frequency analytical processor 206 analyzes the input digital signal through Fourier transform, and calculates a frequency difference between the reference wave 231 and the return wave 232 from frequency peak data detected by the analysis. Using the frequency difference, the LiDAR device 200 acquires and outputs at least one of the distance to the object 300 and the relative speed of the object 300.

For typical FMCW-LiDAR devices using tunable laser beams, linearity of wavelength changes with time is a challenge. The accuracy of measurement might significantly decrease if the level of linearity is low.

Incorporating the light source device 1 enables the LiDAR device 200 to change wavelengths over a wide range at high speeds and perform measurement with a tunable laser beam having a high linearity of wavelength changes with time, thus achieving a higher accuracy of measurement.

For two-dimensional scanning a ranging space with continuous tunable laser beams to acquire a three-dimensional point group, one wavelength sweep is performed for one point group. Notably, the term "wavelength sweep" refers to changing a wavelength with time. The ranging space refers to a space in which a distance to an object is measured.

The wavelength sweep rate is obtained by the expression: F×N (Hz), which is F×N times for at least one second where N denotes the number of ranging points per frame of the LiDAR device 200, and F denotes a frame rate.

For example, assuming that the number of ranging points is the product of the number of points in the horizontal direction and the number of points in the vertical direction, and that the number of ranging points in each direction is $10^2$, the total number is $10^4$. The minimum wavelength sweep rate is $10^4 \times 10^2 = 10^6$ (Hz) where the frame rate is $10^2$. That is, 1 (MHz) is obtained.

To increase the frame rate and resolution of the LiDAR device 200, the wavelength sweep rate is to be increased to about 1 MHz.

Further, the accuracy of measurement of the LiDAR device 200 depends not only on the linearity of the wavelength sweep but also on the width of the variable wavelength range. Specifically, as the wavelength range is wider, the accuracy of measurement increases, and distance measurement with a submillimeter wave becomes possible. To expand the wavelength range, the amount of displacement of the second reflector 121 is to be increased to increase the distance between the reflectors.

Figure 20:
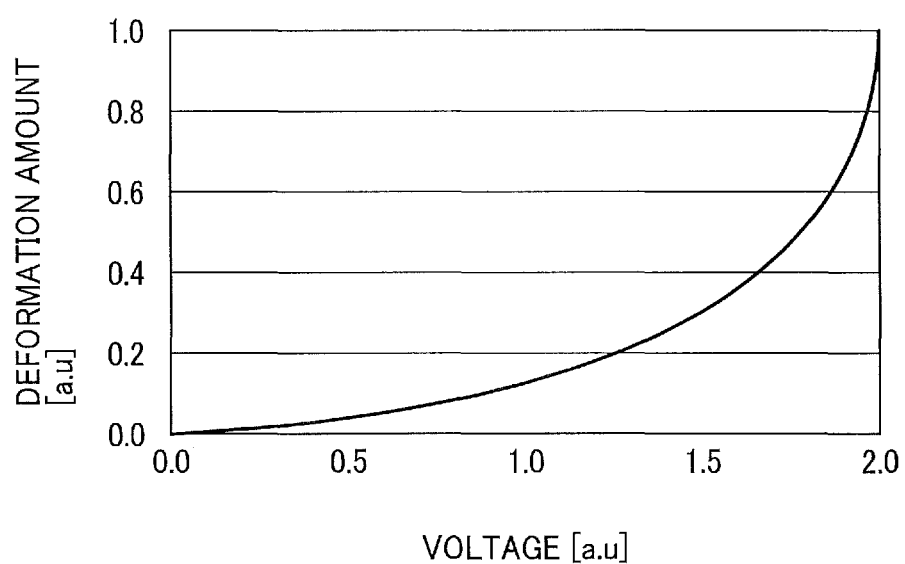
FIG. 20 is a diagram of the relation between drive voltage and the amount of displacement of a reflector in a light source device according to a comparative example.

In the light source device according to a comparative example in which the movable portion is driven by the electrostatic actuation, the amount of displacement of the reflector by the driving of the movable portion is not proportional to the first power of the voltage. FIG. 20 is a graph of the relation between drive voltage and the amount of displacement of the reflector in a light source device according to a comparative example. As illustrated in FIG. 20, the slope of the amount of displacement with respect to the drive voltage is not constant.

This phenomenon is caused by the followings: the position of the reflector is determined by the conditions for balancing the electrostatic attractive force acting between the reflector and the flat plate facing the reflector with the spring restoring force of the movable portion; and the electrostatic attractive force is proportional to the square of the voltage.

Incorporating such a light source device that drives the movable portion with the electrostatically actuation into the LiDAR device takes effort to distort drive voltage in advance to obtain a higher linearity of wavelength sweep, resulting in complicated control.

The resonance frequency of the movable portion is proportional to the square root of the reciprocal of the density of the movable portion, the square root of the reciprocal of the thickness of the movable portion, and the drive voltage. In view of such relations, to increase the resonance frequency tenfold, the density or thickness is to be reduced to one-hundredth, or the drive voltage is to be increased up to tenfold.

It is a challenge to reduce the density or thickness of the movable portion while maintaining its mechanical strength sufficient to prevent breakage of the movable portion. Further, increasing the drive voltage is restricted by the specification such as the size, operational reliability, and power consumption of the optical device, including a light source device.

The resonance frequency of the electrostatically-actuated movable portion is inversely proportional to the amount of displacement thereof. With such an inverse relation, the amount of displacement sufficient to increase the wave range cannot be obtained while achieving actuation with approximately one MHz. As described above, incorporating the electrostatically-actuated light source device, which actuates the movable portion with the electrostatic actuation, into the FMCW-LiDAR device fails to achieve a higher accuracy of measurement.

However, using the light source device 1 according to an embodiment of the present disclosure allows a tunable laser beam whose wavelength is changeable over a wide wavelength range at high speeds. This increases the frame rate of the LiDAR device 200 to increase the spatial resolution of the object 300 within a plane (i.e., an XY plane) and improve the accuracy of measurement of at least one of the distance to the object 300 and the speed of the object 300 relative to the LiDAR device 200.

Fifth Embodiment

Figure 21:
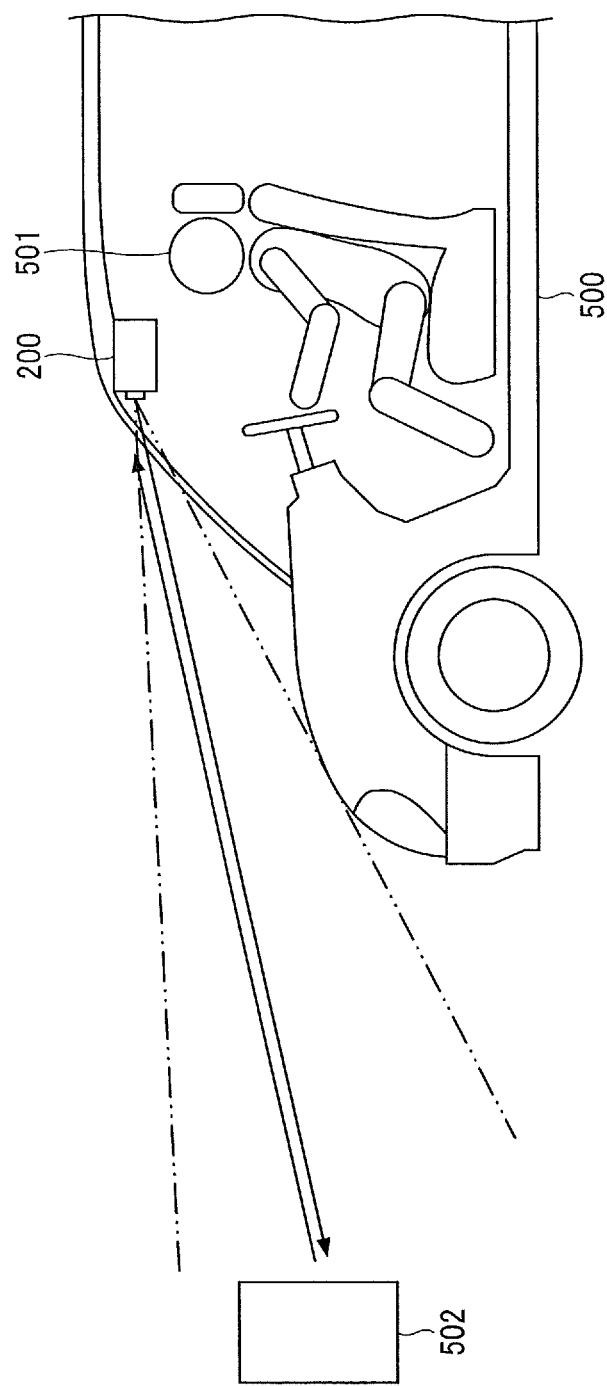
FIG. 21 is an illustration of a vehicle as a mobile object according to a fifth embodiment.

Next, a fifth embodiment will be described. The fifth embodiment relates to a mobile object. FIG. 21 is an illustration of a vehicle as a mobile object according to a fifth embodiment. A vehicle 500 as an example of a mobile object according to the fifth embodiment is mounted with a LiDAR device 200 according to the fourth embodiment at an upper portion of the windshield. The LiDAR device 200 is an example of a distance measurement apparatus that measures at least one of a distance to an object and the speed of the object. The light source device 1 emits a light beam to an object 502, and the photosensor 204 receives the light beam reflected and returned from the object 502. The LiDAR device 200 according to the present embodiment calculates a distance to the object 502 around the vehicle 500 based on the laser beam reflected from the object 502. The measurement result of the LiDAR device 200 is input to a controller as processing circuitry included in the vehicle 500, and the controller controls the operation of the mobile object based on the measurement result of the LiDAR device 200. Alternatively, the controller displays a warning on a display provided in the vehicle 500 for the driver 501 of the vehicle 500 based on the measurement result of the LiDAR device 200.

The fifth embodiment in which the LiDAR device 200 is mounted on the vehicle 500 enables recognition of the location of an object 502 around the vehicle 500 at a high precision. The installation position of the LiDAR device 200 is not limited to an upper and front portion of the vehicle 500, and the LiDAR device 200 may be mounted at a side surface or a rear portion of the vehicle 500. In this example, the LiDAR device 200 is provided in the vehicle 500. Alternatively, the LiDAR device 200 may be provided in an aircraft or a ship. Still alternatively, the LiDAR device 200 may be provided in mobile objects such as drones and robots that autonomously move without a driver.

Numerous additional modifications and variations are possible in light of the above teachings. It is therefore to be understood that within the scope of the appended claims, the disclosure of the present disclosure may be practiced otherwise than as specifically described herein. For example, elements and/or features of different illustrative embodiments may be combined with each other and/or substituted for each other within the scope of this disclosure and appended claims.

In addition, the numbers such as ordinal numbers and quantities used above are all examples for specifically describing the technology of the present invention, and the present invention is not limited to the exemplified numbers. In addition, the relation of connection between the components are illustrated for specifically describing the technology of the present invention, and the relation of connection for implementing the function of the present disclosure is not limited thereto.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), a digital signal processor (DSP), a field programmable gate array (FPGA), and conventional circuit components arranged to perform the recited functions.

The invention claimed is:

1. An optical device comprising:
a first reflector;
a second reflector facing the reflector;
a light emitter between the first reflector and the second reflector;
a base supporting the second reflector with space between the light emitter and the second reflector, the base having:
a first region; and
a second region having a lower stiffness than the first region, the second region having the second reflector and a piezoelectric body thereon; and
the piezoelectric body configured to, in response to application of drive voltage, deform to cause the second region to deform to drive the second reflector so as to change a distance between the first reflector and the second reflector,
wherein the optical device is configured to emit a laser beam whose wavelength is changeable with the distance between the first reflector and the second reflector.

2. The optical device according to claim 1,
wherein the second region is thinner than the first region.

3. The optical device according to claim 1,
wherein in the second region, the second reflector is surrounded by at least a part of the piezoelectric body.

4. The optical device according to claim 1,
wherein the second reflector overlaps with at least part of the piezoelectric body.

5. The optical device according to claim 1,
wherein the piezoelectric body is on a surface of the second region, facing the light emitter.

6. The optical device according to claim 1,
wherein the piezoelectric body is one surface of the second region, opposite to the other surface facing the light emitter.

7. The optical device according to claim 1, wherein
the base is a first base, and the optical device further comprising:
a second base supporting the first base and including:
a third region; and
a fourth region connecting the first base to the third region, the fourth region having a stiffness lower than the third region; and
a driver configured to deform the fourth region to drive the first base so as to change at least one of a distance between the first reflector and the second reflector and a tilt angle of the second reflector relative to the first reflector.

8. The optical device according to claim 7,
wherein the second reflector and the second region have a resonance frequency different from a resonance frequency of the first base and the third region.

9. The optical device according to claim 7,
wherein the fourth region includes multiple beams whose adjacent ends are coupled to each other to form a meander structure.

10. The optical device according to claim 7,
wherein the fourth region includes two or more fourth regions, and the driver includes two or more drivers,
wherein the two or more fourth regions include two or more drivers, respectively.

11. The optical device according to claim 1,
wherein the base includes multiple second regions, the second reflector includes multiple second reflectors, and the piezoelectric body includes multiple piezoelectric bodies, and
wherein the multiple second regions include the respective second reflectors and the respective piezoelectric bodies.

12. The optical device according to claim 11
wherein each of the piezoelectric bodies independently drives corresponding one of the second reflectors.

13. The optical device according to claim 1,
wherein the second reflector is a mirror on a component of the second region.

14. The optical device according to claim 1,
wherein the second reflector includes a periodic structure on a component of the second region.

15. The optical device according to claim 1,
wherein the second region includes a component including a multilayer-film mirror.

16. A distance measurement apparatus comprising:
the optical device according to claim 1 to emit a laser beam to an object;
a photosensor configured to receive the laser beam reflected from the object; and
circuitry to measure at least one of a distance to the object and a speed of the object based on the received laser beam.

17. A mobile object comprising:
the distance measurement apparatus according to claim 16 to measure at least one of a distance to the object and a speed of the object based on the laser beam reflected from the object; and
processing circuitry configured to control movement of the mobile object based on a measurement result obtained by the distance measurement apparatus.

* * * * *